(12) United States Patent
Kubo et al.

(10) Patent No.: US 6,980,604 B2
(45) Date of Patent: Dec. 27, 2005

(54) TRANSMISSION DEVICE AND TRANSMISSION METHOD

(75) Inventors: Tokuro Kubo, Kawasaki (JP); Takayoshi Ode, Kawasaki (JP); Kazuo Nagatani, Kawasaki (JP); Hajime Hamada, Kawasaki (JP); Hiroyoshi Ishikawa, Kawasaki (JP); Yasuyuki Oishi, Kawasaki (JP); Nobukazu Fudaba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 747 days.

(21) Appl. No.: 09/973,613

(22) Filed: Oct. 9, 2001

(65) Prior Publication Data

US 2002/0097811 A1    Jul. 25, 2002

(30) Foreign Application Priority Data

Jan. 25, 2001 (JP) .............................. 2001-017045

(51) Int. Cl.[7] .......................................... H04L 25/49
(52) U.S. Cl. ..................... 375/296; 375/297; 455/63.1; 455/114.3
(58) Field of Search ................................ 375/278, 284, 375/285, 295, 296, 297; 455/63.1, 114.2, 455/114.3, 126; 332/123, 124, 159, 160, 332/161, 162; 330/107, 136, 149

(56) References Cited

U.S. PATENT DOCUMENTS

| | | | |
|---|---|---|---|
| 5,699,383 A * | 12/1997 | Ichiyoshi | 375/297 |
| 5,909,823 A * | 6/1999 | Ranft et al. | 221/129 |
| 5,959,500 A * | 9/1999 | Garrido | 330/151 |
| 6,552,609 B2 * | 4/2003 | Hamada et al. | 330/149 |
| 6,567,478 B2 * | 5/2003 | Oishi et al. | 375/297 |
| 6,639,950 B1 * | 10/2003 | Lagerblom et al. | 375/297 |
| 6,741,663 B1 * | 5/2004 | Tapio et al. | 375/297 |
| 6,757,525 B1 * | 6/2004 | Ishikawa et al. | 455/114.3 |
| 6,907,085 B2 * | 6/2005 | Kubo et al. | 375/285 |
| 2001/0007435 A1 * | 7/2001 | Ode et al. | 330/149 |
| 2001/0051504 A1 * | 12/2001 | Kubo et al. | 455/63 |

FOREIGN PATENT DOCUMENTS

| | | |
|---|---|---|
| JP | 06-054006 | 2/1994 |
| JP | 09-233145 | 9/1997 |
| JP | 2000-013455 | 1/2000 |

* cited by examiner

*Primary Examiner*—Chieh M. Fan
(74) *Attorney, Agent, or Firm*—Katten Muchin Rosenman LLP

(57) ABSTRACT

The present invention provides a transmission device for predistorting a digital signal in order to compensate distortion, then amplifying and transmitting it. A digital input signal is converted to a first analog signal by a first D/A converter. Separately, the digital input signal is also subjected to predistortion. A compensating signal is then generated from the digital input signal and the predistorted signal. The compensating signal generated thereby is converted into a second analog signal by a second D/A converter. The first analog signal and second analog signal are then added, this addition operation giving a compensated analog transmission signal. This analog transmission signal is supplied to the amplifier for amplification, and then transmitted via an antenna.

26 Claims, 10 Drawing Sheets

TRANSMISSION DEVICE AND TRANSMISSION METHOD

BACKGROUND OF THE INVENTION

1. Field of the Invention

The present invention relates to a transmission device and transmission method for amplifying and transmitting an analog signal that has been converted from a digital input signal, and in particular relates to a transmission device and transmission method for predistorting a digital signal in order to compensate distortion, then amplifying and transmitting it.

2. Description of the Related Art

As out-of-band power emission in wireless communications systems is regulated, such systems are equipped with linearizers (distortion compensating devices) in order to minimize out-of-band power emission into surrounding channels due to non-linearity of the amplifiers that amplify signals for transmission. FIG. 13 is a block diagram of an exemplary transmission device in a conventional wireless communications system.

This transmission device has a predistortion linearizer that includes a multiplier 210, a power calculator 211, a compensation table 212, a distortion-compensation coefficient update unit 213, and a subtracter 214.

Each of four baseband transmission signals (each signal composed of a digital I signal and a digital Q signal) is modulated by one of four modulators 201 to 204 and then subjected to frequency shifting by frequency shift multipliers 205 to 208 so as to avoid overlapping frequency bands. The four transmission signals are then converted into a single digital signal (one digital I signal and one digital Q signal) by an adder 209, and supplied to the multiplier 210, power calculator 211, and subtracter 214.

The power calculator 211 calculates a power value p for an input transmission signal and supplies the power value p to the compensation table 212. The compensation table 212 then supplies a distortion-compensation coefficient corresponding to the power value p to the multiplier 210 and the distortion-compensation coefficient update unit 213. The input transmission signal and distortion-compensation coefficient are multiplied by the multiplier 210 to effect predistortion of the transmission signal.

In a modulating NCO (numerically controlled oscillator) 215 the transmission signal output by the multiplier 210 is subjected to quadrature modulation to a single digital signal and is converted to an intermediate frequency band signal which is supplied to a DAC (digital/analog converter) 216.

The input digital signal is converted into an analog transmission signal by the DAC 216. The analog signal is passed through a filter 217 to eliminate the baseband components, and is then converted to radio frequency band by an RF mixer 218, amplified by an amplifier 219, and transmitted from an antenna 220.

A portion of the output signal from the amplifier 219 is supplied as a feedback signal to an IF mixer 221.

At the IF mixer 221 the feedback signal is converted from the radio frequency band to the intermediate frequency band and then attenuated by a variable attenuator 222 by the inverse of the amplification factor of the amplifier 219. The attenuated feedback signal is eliminated of the radio frequency band components by a filter 223 and is then converted to a digital signal by an ADC (analog/digital converter) 224.

This digital feedback signal is subjected to quadrature demodulation by a demodulating NCO 225, converted from the IF band to baseband, and supplied to the subtracter 214 and distortion-compensation coefficient update unit 213.

The feedback signal supplied to the subtracter 214 is subtracted from a reference signal from the adder 209 to determine a differential signal for the two signals. This differential signal is equivalent to a distortion signal component contained in the feedback signal. This distortion signal component is supplied to the distortion-compensation coefficient update unit 213.

On the basis of the distortion signal component from the subtracter 214, the distortion-compensation coefficient from the compensation table 212, and the feedback signal from the demodulating NCO 225, the distortion-compensation coefficient update unit 213 determines a new distortion-compensation coefficient, whereupon the compensation table 212 is updated with this new distortion-compensation coefficient. The new distortion-compensation coefficient is used to compensate a subsequently input transmission signal.

The above procedure is repeated for each input transmission signal.

Thus, in conventional transmission devices, distortion-compensated signals are converted from digital signals to analog signals by a DAC 216. However, as distortion-compensated signals typically have greater amplitude than do the same signals prior to compensation, digital-to-analog conversion of compensated signals requires a DAC with high bit precision (i.e., a large number of bits).

However, as an inverse relationship exists between bit precision and the speed of conversion by a DAC, the use of a DAC 216 with high bit precision necessarily involves sacrificing conversion speed to a certain extent. Wireless communications systems developed in recent years, particularly systems using high frequency signals—such as communications systems in CDMA base stations—require DACs that can perform conversion rapidly, and in such systems the sacrifice of conversion speed associated with high bit precision becomes unacceptable.

Another drawback is that a phase difference between the feedback signal and reference signal may be produced in the transmission device due to factors such as delay caused by the length of the transmission path of the feedback signal or phase jitter in the local oscillator that performs band conversion (frequency conversion) of the signal. The presence of a phase difference may make it impossible to perform compensation properly. Further, a DAC having high bit precision may be required in order for the DAC to convert a transmission signal with compensated the phase difference.

SUMMARY OF THE INVENTION

With the foregoing in view, it is an object of the present invention to provide a transmission device and transmission method that enable compensation to be performed without the need to increase DAC bit precision, and that eliminate all phase difference in the transmission device other than phase distortion produced in the feedback signal by the amplifier.

It is a further object of the invention to provide a transmission device and transmission method that eliminate both phase difference phase distortion produced by the amplifier and phase difference in the transmission device other than phase distortion produced by the amplifier.

To achieve these objects, the transmission device herein provides a transmission device for predistorting a digital input signal to compensate nonlinear distortion produced by an amplifier, converting said digital input signal to an analog signal, amplifying it by means of said amplifier, and transmitting it, comprising: a first digital/analog converter for converting said digital input signal to a first analog signal; a distortion-compensating signal generator for generating a distortion-compensating signal from said digital input signal and a predistortion signal, said predistortion signal being generated by predistorting said digital input signal on the basis of a distortion-compensation coefficient determined from said digital input signal supplied as a reference signal, and a feedback signal fed back from the output of said amplifier; a second digital/analog converter for converting the distortion-compensating signal generated by said distortion-compensating signal generator into a second analog signal; an adder for adding said second analog signal to said first analog signal and supplying to said amplifier the analog signal resulting from said addition operation; and a first phase difference compensator for compensating any phase difference in said transmission device other than phase distortion included in said nonlinear distortion of said amplifier for said feedback signal, said phase difference being detected on the basis of said feedback signal and said reference signal, and supplying said phase difference-compensated feedback signal to said distortion-compensating signal generator.

According to the present invention, a digital input signal is converted to a first analog signal by means of a first digital/analog converter. Separately, the digital input signal is also subjected to predistortion. A compensating signal is then generated from the digital input signal and the predistorted signal. The compensating signal generated thereby is converted into a second analog signal by a second digital/analog converter. The first analog signal and second analog signal are then added, this addition operation giving a compensated analog transmission signal. This analog transmission signal is supplied to the amplifier for amplification.

In this way, a digital input signal and a compensating signal are converted separately by means of a first digital/analog converter and a second digital/analog converter, respectively. This obviates the need for a digital/analog converter having high bit precision, as would be needed to convert a predistorted digital input signal to an analog signal. Accordingly, faster conversion is possible.

Phase difference of the transmission device other than phase distortion resulting from nonlinear distortion produced by the amplifier is detected on the basis of a feedback signal fed back from the amplifier output and the original digital input signal supplied as a reference signal, and the appropriate compensation is made. The phase difference-compensated feedback signal is then supplied to a distortion-compensating signal generator.

In this way, the distortion-compensating signal generator generates a compensated signal in which only nonlinear distortion produced by the amplifier is compensated. This allows the distortion-compensating signal generator to reliably compensate nonlinear distortion produced by the amplifier. Further, since the second digital/analog converter is supplied only with a signal in which nonlinear distortion produced by the amplifier has been compensated, bit precision can be lower than when the signal has been compensated for another phase difference, making conversion faster to a corresponding degree.

In a first embodiment aspect according to the invention, said distortion-compensating signal generator comprises: a compensation table having distortion-compensation coefficients corresponding to power values of said digital input signal; a distortion-compensation coefficient update unit for determining a new distortion-compensation coefficient from said reference signal, said feedback signal, and the distortion-compensation coefficient corresponding to said digital input signal; a multiplier for multiplying the distortion-compensation coefficient corresponding to said digital input signal by said digital input signal in order to predistort said digital input signal; and a subtracter for determining a differential signal from the output signal of said multiplier and said digital signal, and outputting said differential signal as said compensated signal.

This enables adaptive predistortion wherein the distortion-compensation coefficient is updated for each digital input signal.

In a preferred embodiment of the invention, with the system in a state wherein said adder is not performing addition of said first analog signal and said second analog signal, with said first analog signal being output as the output signal of said adder, and furthermore in a state wherein said amplifier is operating in the linear region, said first phase difference compensator is operational so as to detect said phase difference on the basis of said reference signal and said feedback signal, and compensates for said phase difference.

According to this embodiment the first phase difference compensator performs compensation (i.e. initial phase control) while the transmission device performs initialization etc.

In another preferred embodiment of the invention, said transmission device further comprises a second phase difference compensator for detecting said phase difference on the basis of the distortion-compensation coefficient corresponding to the power value of said digital input signal, compensating said phase difference, and supplying said phase difference-compensated feedback signal to said distortion-compensating signal generator.

In this way, in addition to the initial phase control performed by the first phase difference compensator, phase control is performed during operation of the transmission device to transmit a required transmission signal, enabling phase tracking to compensate phase differences during operation.

DESCRIPTION OF THE PREFERRED EMBODIMENTS

A fuller understanding of the invention is provided through the following description of the embodiments, which are merely illustrative and not limiting of the technical scope of the invention.

First Embodiment

Figure 1:
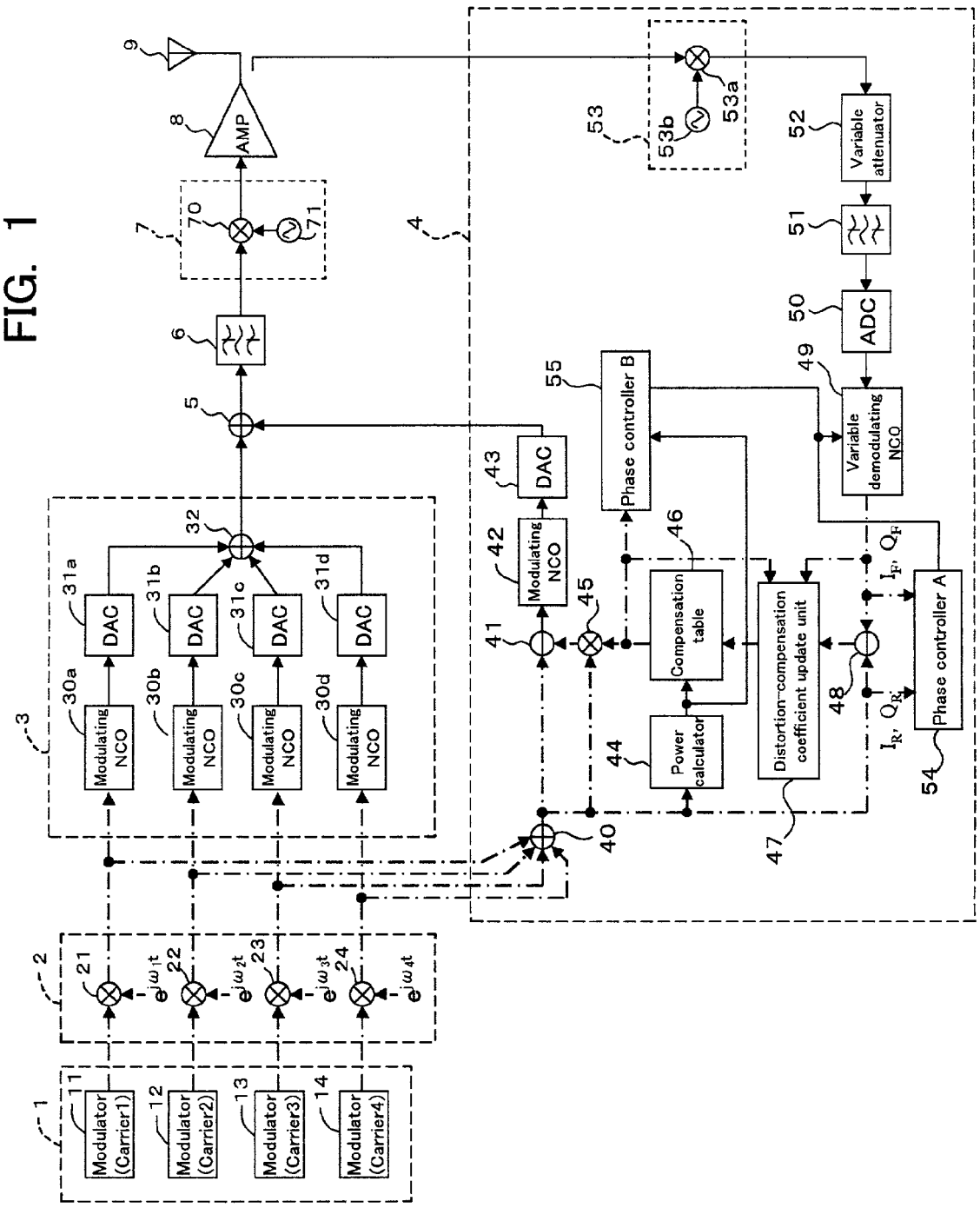
FIG. 1 is a block diagram depicting an exemplary transmission device according to a first embodiment of the invention.

FIG. 1 is a block diagram depicting an exemplary transmission device according to a first embodiment of the invention.

In the drawing, signal lines are represented by either solid lines or broken lines. Each signal line represented by a broken line is actually composed of two signal lines (for simplicity these are represented by a single broken line) that carry the transmission signals input to the transmission device, namely, the digital "I" channel Ich and the digital "Q" channel Qch, respectively. However, the signal line represented by a broken line output from the compensation table 46 is composed of two signal lines that respectively carry a distortion-compensation coefficient $h_I$ (real part of the distortion-compensation coefficient) and a distortion-compensation coefficient $h_Q$ (imaginary part of the distortion-compensation coefficient). signal lines represented by solid lines, on the other hand, are each composed of one signal line for carrying one signal wherein the digital I signal and digital Q signal have undergone quadrature modulation etc. This convention is used in FIG. 2 and other drawings as well.

This transmission device modulates and transmits four carrier signals, and has a carrier modulator 1, a frequency shifter 2, a main signal converter 3, a distortion-compensating signal generator 4, an adder 5, a filter 6, an RF mixer unit 7, an amplifier 8, and an antenna 9.

The carrier modulator 1 has modulators 11 to 14 for modulating and outputting the four baseband digital carrier signals. The baseband digital carrier signals (I signals and Q signals) modulated by these modulators 11 to 14 are supplied to the frequency shifter 2.

The frequency shifter 2 has multipliers 21 to 24. One input of each of the multipliers 21 to 24 is supplied with one of the signals from carrier modulator 1, and the other input is supplied with one of four signals $\exp(j\omega_1 t)$ to $\exp(j\omega_4 t)$ having the shift frequency. Multipliers 21 to 24 multiply (complex multiplication) the signals supplied to their first and second inputs. In this way the carrier signals supplied to multipliers 21 to 24 are frequency-shifted by $\omega_1/2\pi$, $\omega_2/2\pi$, $\omega_3/2\pi$, and $\omega_4/2\pi$, respectively, for output.

The extent of frequency shift is selected such that the carrier signals do not overlap when synthesized in the adder 32. In a W-CDMA (wideband CDMA) system, for example, frequency shift would be set to $\omega_1/2\pi=\omega_2/2\pi=\omega_3/2\pi=\omega_4/2\pi=5$ MHz. Signals output from multipliers 21 to 24 are supplied to the main signal converter circuit 3 and distortion-compensating signal generator 4.

The main signal converter 3 has modulating NCOs 30a to 30d, digital/analog converters (hereinafter "DAC") 31a to 31d, and an adder 32.

Each of the modulating NCOs (numerically controlled oscillators) 30a to 30d performs quadrature modulation of a baseband digital I signal and digital Q signal input to it from frequency shifter 2, synthesizes a single digital signal, and converts the synthesized single digital signal from a baseband signal to an intermediate frequency (hereinafter "IF") band signal by means of an oscillator signal ($\exp(j\omega_5 t)$).

The signals output from modulating NCOs 30a to 30d are supplied to DACs 31a to 31d where they are converted from digital signals to analog signals, which are then supplied to adder 32. In this way, in the main signal converter 3 only transmission signals that have not been compensated (main signals) are converted to analog signals by DACs 31a to 31d. As a result, DACs 31a to 31d require less bit precision that is the case where compensated transmission signals must be converted, making conversion faster to a corresponding degree.

Adder 32 adds the four analog signals from DACS 31a to 31d, and the result of the addition operation is supplied to adder 5.

The distortion-compensating signal generator 4 has an adder 40, a subtracter 41, a modulating NCO 42, a DAC 43, a power calculator 44, a multiplier 45, a compensation table 46, a distortion-compensation coefficient update unit 47, a subtracter 48, a variable demodulating NCO 49, an analog/digital converter (hereinafter "ADC") 50, a filter 51, a variable attenuator 52, an IF mixer unit 53, a phase controller A denoted by reference numeral 54, and a phase controller B denoted by reference numeral 55.

The adder 40 takes the four I signals and four Q signals from the frequency shifter 2, adds the I signals together and the Q signals together, and supplies the I signal and Q signal resulting from the addition operations to the subtracter 41, power calculator 44, multiplier 45, and phase controller A, as well as supplying these to subtracter 48 as a reference signal (hereinafter the I component of the reference signal is denoted as "$I_R$ signal" and the Q component as "$Q_R$ signal").

The power calculator 44 calculates a power value p ($p=I^2+Q^2$) for the I signal and Q signal supplied to it by adder 40, and supplies the resultant power value p to the compensation table 46 and phase controller B.

The compensation table 46 stores in table form distortion-compensation coefficients (coefficient $h_I$ for the I signal and coefficient $h_Q$ for the Q signal ($h_I+jh_Q$ in complex denotation)) corresponding to various power values p, and outputs to multiplier 45 and phase controller B distortion-compensation coefficients $h_I$ and $h_Q$ corresponding to the power value p supplied to it by power calculator 44.

The adder 45 multiplies (complex multiplication, i.e. $(I+jQ)\times(h_I+jh_Q)$) the I signal and Q signal from adder 40 by the distortion-compensation coefficients $h_I$ and $h_Q$ from the compensation table 46, and supplies the result of the multiplication operation (the I signal and Q signal) to the subtracter 41.

From the signal from adder 40 and the signal from multiplier 45 the subtracter 41 determines a differential signal, and this differential signal is supplied to the modulating NCO 42. This differential signal is determined as a differential signal for the I signal and a differential signal for the Q signal. By determining this differential signal, the compensating signal component can be extracted from an input transmission signal.

Like the modulating NCOs 30a to 30d described earlier, the modulating NCO 42 performs quadrature modulation of the compensating signal (I signal and Q signal), converts it from the baseband to the IF band, and outputs the result to the DAC 43. The DAC 43 converts the IF band compensating signal (digital signal) to an analog signal which is supplied to the adder 5.

The adder 5 adds the transmission signal from the main signal converter 3 (adder 32) with the compensating signal (analog signal) from distortion-compensating signal generator 4 (DAC 43) and supplies the signal resulting from the addition operation to the filter 6. By means of this addition operation the main signal and compensating signal are added to generate a predistorted transmission signal.

The filter 6 filters the baseband component (low band component) from the input transmission signal and supplies the filtered transmission signal to the RF mixer unit 7. The Mixer 7 has a mixer 70 to which transmission signals are input, and a local oscillator 71 for supplying to the mixer 70 a frequency signal for converting an IF band signal to a radio frequency (hereinafter "RF") band signal. In this way the mixer unit 7 converts IF band transmission signals to RF band transmission signals supplied to the amplifier (power amp) 8.

Figure 12A:
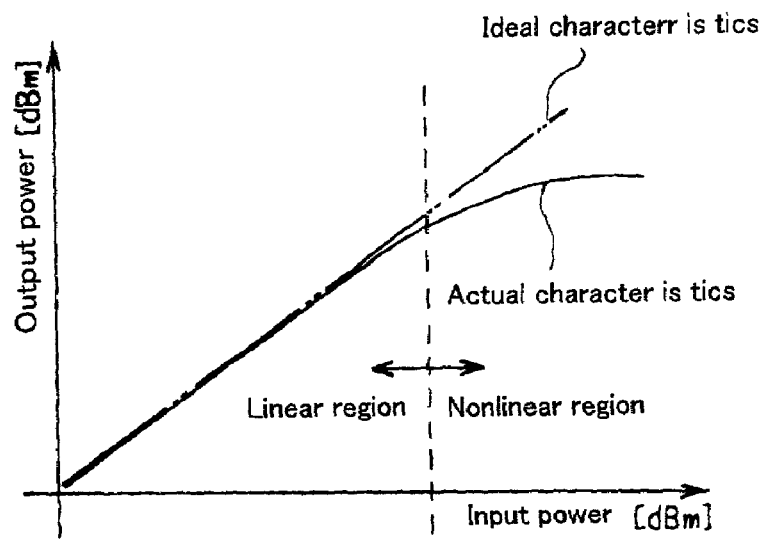
FIG. 12A shows the input/output power characteristics of a amplifier.
Figure 12B:
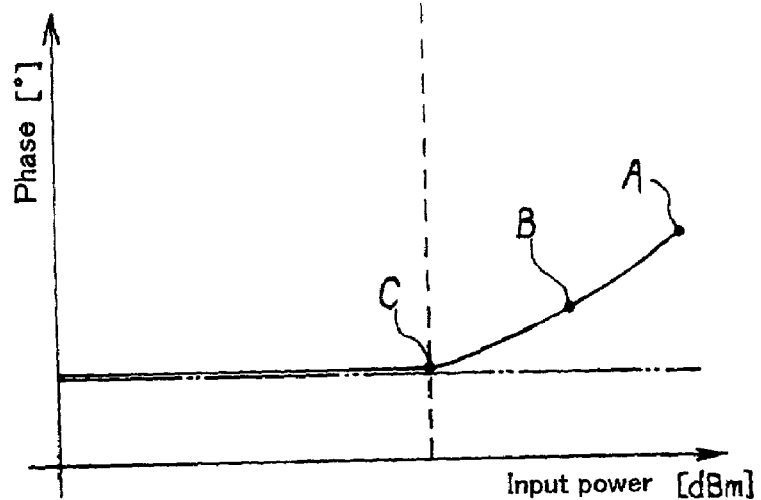
FIG. 12B shows the relationship between input power and phase distortion of output signal.
Figure 13:
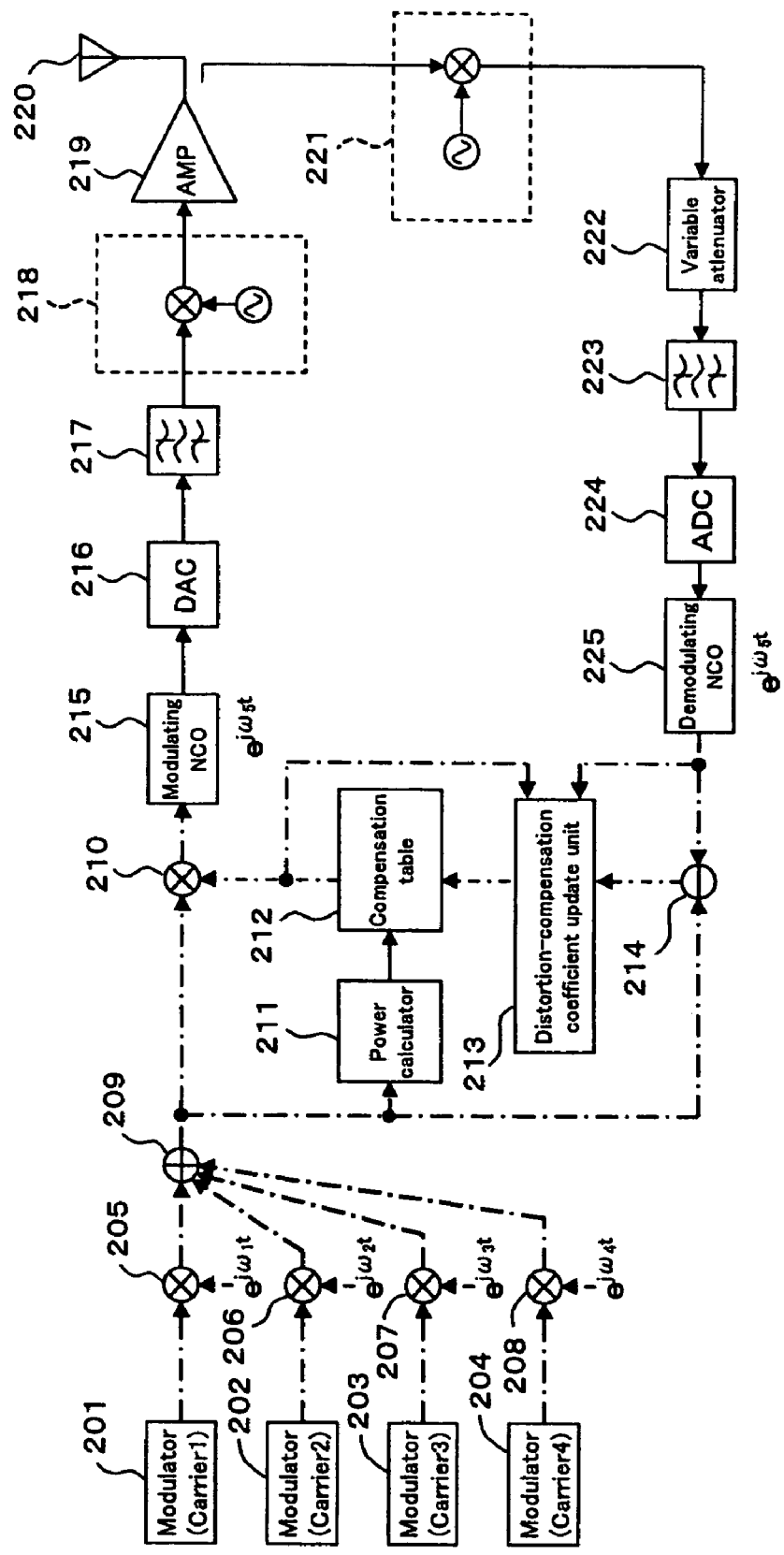
FIG. 13 is a block diagram of an exemplary transmission device in a conventional wireless communications system.

The amplifier 8 amplifies the input transmission signals in such a way as to produce the input/output characteristics shown in FIG. 12, and then outputs the signals. As indicated by the solid line FIG. 12A, in the region in which input signal power (hereinafter "input power") is relatively low (the linear region), input power and output signal power (hereinafter "output power") are proportional, whereas in the region in which input power is relatively high (the nonlinear region), input power and output power cease to be proportional, with output power tending to have greater amplitude distortion and to reach saturation at higher input power. As shown by the solid line in FIG. 12B, output power phase similarly has greater phase distortion at higher input power in the nonlinear region.

A transmission signal output from the amplifier 8 having these input/output characteristics is transmitted from the antenna 9, and a portion thereof is supplied as a feedback signal to the IF mixer unit 53 of the distortion-compensating signal generator 4.

The IF mixer unit 53 comprises a mixer 53a having as input the feedback signal from amplifier 8, and a local oscillator 53b for supplying to the mixer 53a a frequency signal for converting an RF band signal to an IF band signal. In this way the mixer unit 53 converts RF band feedback signals to IF band feedback signals which are supplied to the variable attenuator 52.

The variable attenuator 52 has linearity and is designed to attenuate the input IF band feedback signal without producing non-linearity (amplitude distortion and phase distortion). In the absence of distortion, the attenuation is set to the inverse of amplification (gain) by amplifier 8 indicated by the theoretical line (double-dot dashed line) in FIG. 12A. For example, assuming the amplification G (=output power $P_{OUT}$/input power $P_{IN}$) by the amplifier 8 is represented by the theoretical line, the attenuation by the variable attenuator 52 is set to 1/G.

In this way, where a signal has been amplified without distortion by the amplifier 8 in the linear region, the feedback signal is attenuated to the same amplitude as the signal before amplification by the amplifier 8; and where the amplifier 8 has distortion in the nonlinear region, the feedback signal is attenuated to a signal having a power value, which corresponds to the distortion, different from the power value prior to amplification by the amplifier 8 so that the distortion by the amplifier 8 is also reflected in the feedback signal subsequent to the attenuation. The attenuated feedback signal is supplied to the filter 51.

The filter 51 filters the RF band component (high band component) from the input feedback signal and supplies the filtered feedback signal to the ADC 50. The ADC 50 converts the feedback signal (analog signal) from the filter 51 into a digital signal and supplies the converted digital feedback signal to the variable demodulating NCO 49.

The variable demodulating NCO 49 performs quadrature demodulation of the digital feedback signal from the ADC 50, converts same from an IF band signal to a base band signal, and outputs it as an I component signal (hereinafter "$I_F$ signal") and a Q component signal (hereinafter "$Q_F$ signal"). In the variable demodulating NCO 49 quadrature demodulation is performed with phase controlled by the phase controller A or B. This variable demodulating NCO 49 and phase controllers A and B are described in greater detail later.

The feedback signal ($I_F$ signal and $Q_F$ signal) output by the variable demodulating NCO 49 is supplied to the subtracter 48, distortion-compensation coefficient update unit 47, and phase controller A.

The subtracter 48 determines a differential signal from the reference signal supplied to it by the adder 40 and the feedback signal from the amplifier 8, and supplies this differential signal to the distortion-compensation coefficient update unit 47. Where the amplifier 8 is operating in the nonlinear region, this differential signal will contain the distortion produced by the amplifier 8 (both amplitude distortion and phase distortion) as well as phase difference produced by sources other than the amplifier 8, whereas if amplifier 8 is operating in the linear region, it will contain only phase difference produced by the sources other than the amplifier 8. The phase difference produced by the sources other than the amplifier 8 (hereinafter "analog section phase difference") includes at least two kinds of distortion: phase difference resulting from signal delay, and phase difference (phase rotation) resulting from deviation of the phase of signal from the local oscillator 71 and/or 53b and the phase of the feedback signal.

The distortion-compensation coefficient update unit 47 determines a new distortion-compensation coefficient from this differential signal, the feedback signal, and a distortion-compensation coefficient supplied to it by the compensation table 46, and uses this new distortion-compensation coefficient to update the distortion-compensation coefficient corresponding to the power value p measured by the power calculator 44. This new distortion-compensation coefficient is used for subsequent compensation of transmission signals.

In the present embodiment, the phase controllers A and B do not compensate distortion in the nonlinear region (non-linear distortion) by amplifier 8, but rather the analog section phase difference. The phase controller A is designed to operate when the transmission device is not performing linearization (e.g., during initialization at startup of the transmission device). At this time the system is controlled so that, for example, the signal from the DAC 43 is not output to the adder 5 so that the feedback loop for performing linearization is open (OFF). Thus, the signal from the adder 32 is not added with the compensating signal by the adder 5 and is output as-received by the adder 5.

The phase controller B, on the other hand, is designed to operate when the transmission device is performing linearization (i.e. when transmitting a signal to be transmitted from the antenna 9). Where the local oscillators (e.g. the local oscillator 71, 53b etc.) provided within the transmission device have no phase-shift, and there is furthermore no deviation in the cycle of the clock signal for the units that perform processing of the digital signal (e.g. the DAC, ADC, etc.), the analog section phase difference is eliminated by means of phase difference compensation performed by the phase controller A. However, if, during operation, the phase shift or deviation in the cycle of the clock signal should occur, the phase controller B performs phase shift tracking and eliminates the analog section phase difference occurring during operation.

When linearization is being performed by the transmission device, the signal from the DAC 43 is output to the adder 5, for example, so that the feedback loop for performing linearization is closed (ON). A control unit, not shown in the drawings, may perform control of the operation of the phase controller A and B, for example.

During operation of the phase controller A, a signal having the power at which the amplifier 8 is operating in the linear region is input to the transmission device. Thus, as noted earlier, the phase controller A operates so as to compensate only the analog section phase difference occurring in the feedback signal.

During operation of the phase controller B, the required transmission signals to be transmitted are being transmitted, and thus in some instances the amplifier 8 may be operating in the nonlinear region. Accordingly, the phase controller B is designed to make a determination, based on the power value p supplied to it by the power calculator 44, as to whether the amplifier 8 is operating in the linear region or the nonlinear region, and to operate in the event that the power value p assumes a predetermined value.

Exemplary predetermined values for this power value p, shown in FIG. 12B, include the power value at point A, the power value at point B, or the power value at point C, some arbitrary power value below point C, or all power values below point C. Point A is the point at which the distortion by the amplifier 8 reaches maximum. The power value at point A may be determined through experimentation with the amplifier 8. Point C is the inflection point between the linear region and nonlinear region for the amplifier 8. The power value at point C may also be determined through experimentation with the amplifier 8. Point B lies between point A and point C, and may be the mid-point (i.e. the point at which phase distortion is one-half that at point A) or some other point. The power value at point B is a value lying between point A and point C, determined by determining power values at these latter two points.

Where the phase controller B is actuated at the power level of point A, phase difference will be compensated at the point at which the phase difference reaches maximum, so that the distortion-compensation coefficient is utilized effectively. Where the phase controller B is actuated at a power level below point C, phase difference will be compensated in the segment with the highest frequency of occurrence, so that the analog section phase difference will be compensated more frequently.

Timing of the operation of the phase controllers A and B and the function of compensating the analog section phase difference are analogous to the above in the second to twelfth embodiments described hereinbelow.

The phase controllers A and B are now described in greater detail.

Figure 2A:
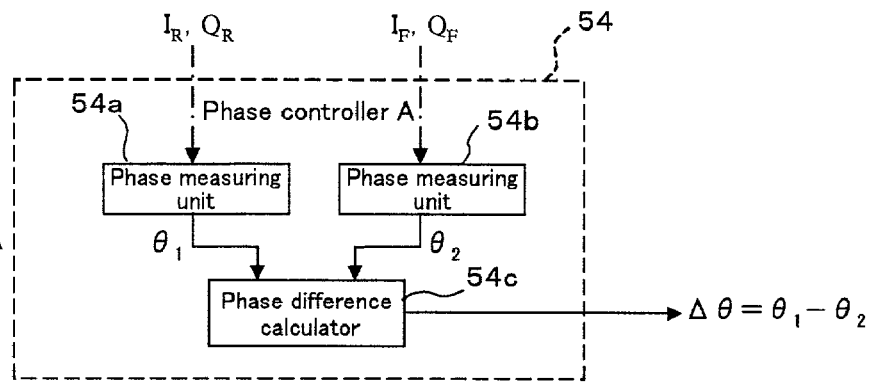
FIG. 2A is a detailed block diagram of a phase controller A according to the first embodiment.

FIG. 2A is a detailed block diagram of the phase controller A (reference numeral 54). The phase controller A has a phase measuring unit 54a for measuring the phase $\theta_1$ of the reference signal $I_R$, $Q_R$, a phase measuring unit 54b for measuring the phase $\theta_2$ of the feedback signal $I_F$, $Q_F$, and a phase difference calculator 54c for calculating the difference $\Delta\theta$ between the phases $\theta_1$ and $\theta_2$.

The phase measuring unit 54a determines the phase $\theta_1$ from the reference signal $I_R$, $Q_R$ using the following equation (1):

$$\theta_1 = \tan^{-1}(Q_R/I_R) \tag{1}$$

Analogously, the phase measuring unit 54b determines the phase $\theta_2$ using the following equation (2):

$$\theta_2 = \tan^{-1}(Q_F/I_F) \tag{2}$$

The phase difference calculator 54c calculates the phase difference $\Delta\theta$ (=$\theta_1-\theta_2$) and supplies this phase difference $\Delta\theta$ to the variable demodulating NCO 49.

As will be described later, the variable demodulating NCO 49 performs frequency conversion using a phase ($j\omega_6 t + \Delta\theta$) equivalent to the phase during frequency conversion from the IF band to baseband (denoted here as $j\omega_6 t$) plus the phase difference $\Delta\theta$. In this way the analog section phase difference is compensated during initialization etc.

Figure 4A:
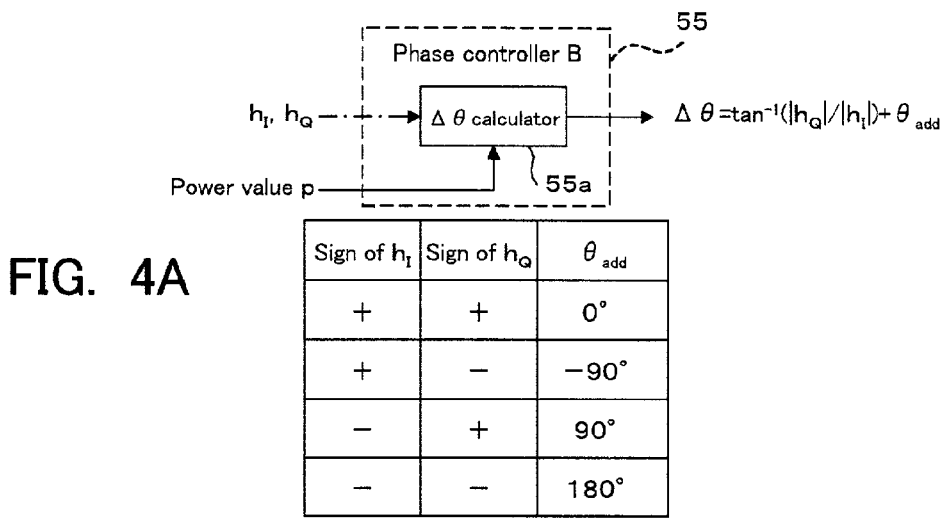
FIGS. 4A, 4B, 4C and 4D are detailed block diagrams of a phase controller B.

FIG. 4A is a detailed block diagram of the phase controller B (reference numeral 55). The phase controller B includes a $\Delta\theta$ calculator 55a. This $\Delta\theta$ calculator 55a has as inputs the distortion-compensation coefficients $h_I$, $h_Q$ from the compensation table 46 and the power values p from the power calculator 44. The $\Delta\theta$ calculator 55a comprises a operation/nonoperation table (not shown) corresponding to the input power values p. This operation/nonoperation table indicates whether or not the $\Delta\theta$ calculator 55a should operate in response to a particular power value p. Where, for example, phase difference compensation is to be performed at the power level at point A in FIG. 12B, described earlier, the operation/nonoperation table would indicate that the element should operate at the power level at point A, and not operate at other power values.

Where the operation/nonoperation table indicates that the operation should occur, the $\Delta\theta$ calculator 55a outputs a $\Delta\theta$ value determined using the following equation (3), whereas if it indicates that the operation should not occur, the $\Delta\theta$ calculator 55a outputs a $\Delta\theta$ value of zero regardless of the value from the compensation table 46 (or the $\Delta\theta$ calculator 55a assumes a disabled state).

$$\Delta\theta = \tan^{-1}(|h_Q|/|h_I|) + \theta_{add} \tag{3}$$

As indicated in the table in FIG. 4A, $\theta_{add}$ can assume a value of 0°, −90°, 90° or 180°, depending on the sign of $h_Q$ and $h_I$.

The output $\Delta\theta$ value (including zero) is supplied to the variable demodulating NCO 49. In this way the variable demodulating NCO 49 performs frequency conversion by means of a phase ($j\omega_6 t + \Delta\theta$) equivalent to the phase during the frequency conversion from the IF band to baseband (denoted here as $j\omega_6 t$) plus the phase difference $\Delta\theta$. As result, the analog section phase difference is compensated during transmission of the transmission signal.

Figure 5:
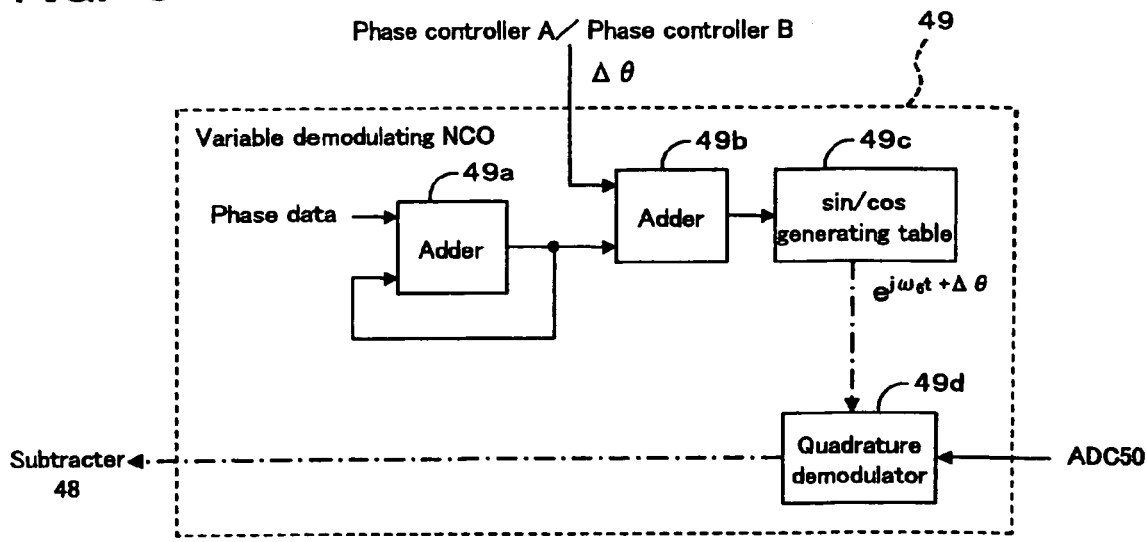
FIG. 5 is a detailed block diagram of a variable demodulating NCO.

FIG. 5 is a detailed block diagram of the variable demodulating NCO 49. The variable demodulating NCO 49 comprises adders 49a, 49b, a sin/cos generating table 49c, and a quadrature demodulator 49d.

The adder 49 is preset by supplying same with phase data consisting of the phase of a signal generated by the sin/cos generating table 49c. In the example shown in FIG. 5 the value of this phase data is $j\omega_6 t$. Here, the angular frequency $\omega_6$ (frequency $\omega_6/2\pi$) is the angular frequency necessary to convert the IF band to baseband. This phase data is also supplied to the adder 49b via the adder 49a.

In addition to the phase data from the adder 49a, the adder 49b has as its input the phase shift (i.e. the phase difference described earlier) $\Delta\theta$ from the phase controller A or B. The adder 49b adds these values and supplies the result of the addition operation $(j\omega_6 t + \Delta\theta)$ to the sin/cos generating table 49c.

The sin/cos generating table 49c generates a sine wave and cosine wave (i.e. $\exp(j\omega_6 t + \Delta\theta)$) signal having the phase $(j\omega_6 t + \Delta\theta)$ of the result of the addition operation supplied to it by the adder 49, and supplies this signal to the quadrature demodulator 49d.

The quadrature demodulator 49d performs quadrature demodulation of the input feedback signal into an I component signal (hereinafter "$I_F$ signal") and a Q component signal (hereinafter "$Q_F$ signal"), as well as converting the signal from the IF band to baseband. During the quadrature demodulation the phase of the output signal of the quadrature demodulator 49d is shifted (phase shifted) by $\Delta\theta$ with respect to the input signal, by means of the sine wave and cosine wave signal supplied by sin/cos generating table 49c. In this way, even if the analog section phase difference $\Delta\theta$ should occur in the feedback signal, the phase difference will be compensated (corrected). As a result the feedback signal contains only nonlinear distortion (amplitude distortion and phase distortion) produced by the amplifier.

In the present embodiment, as the analog section phase difference is compensated by the phase controllers A and B and by the quadrature demodulating NCO 49, the differential signal output from the subtracter 41 contains only nonlinear distortion produced by the amplifier 8. As a result, nonlinear distortion of the amplifier 8 can be compensated properly by the compensation table 46, multiplier 45 etc. The DAC 43 need only to convert nonlinear distortion of the amplifier 8, so less bit precision is required than with conversion of both the analog section phase difference and the nonlinear distortion of the amplifier 8, so correspondingly faster conversion is possible.

In the present embodiment, the adder 32 may be modified to have five inputs rather than four inputs, and the adder 5 omitted, supplying the output signal of the DAC 43 to the adder 33. The digital signal (I signal and Q signal) from the frequency shifter 2 may be converted to an analog signal by a DAC, subjected to quadrature demodulation by a quadrature demodulator, and then supplied to the adder 32. Alternatively, the analog signal from the filter 51 may be subjected to quadrature demodulation by a quadrature demodulator and then converted to a digital signal by an ADC.

Second Embodiment

Phase control by the phase controllers A and B in the first embodiment may be performed during quadrature modulation by the modulating NCOs 30a to 30d, rather than being performed by the quadrature demodulating NCO 49. In this second embodiment, phase is controlled during quadrature modulation in this manner.

Figure 6:
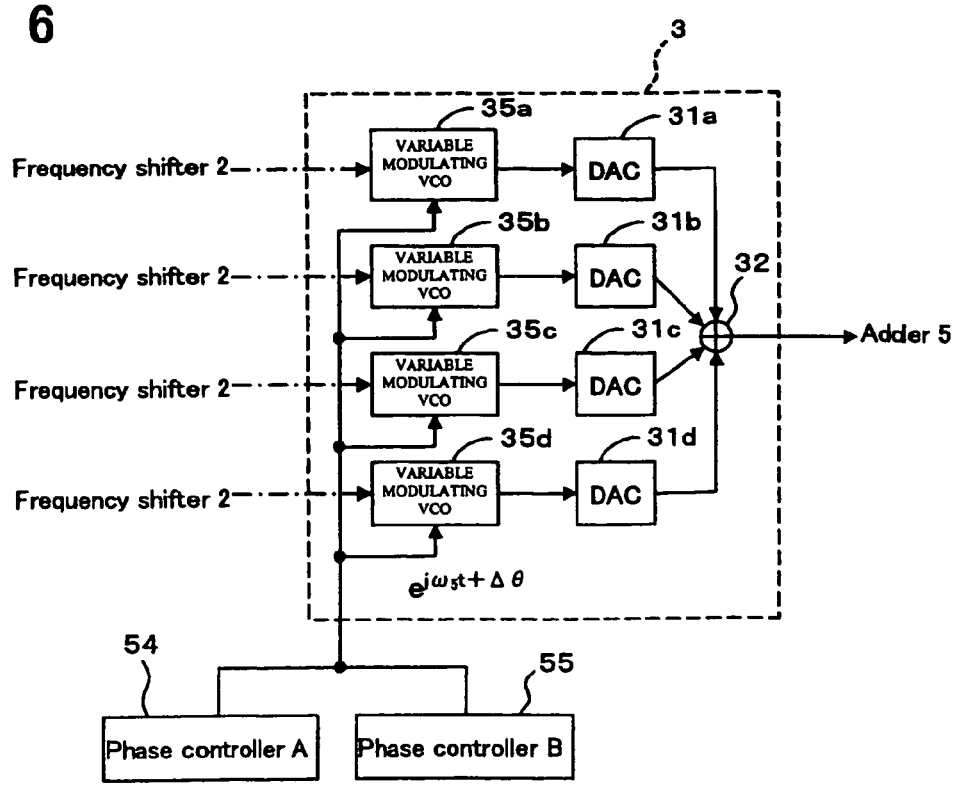
FIG. 6 is a block diagram showing the main signal converter of a transmission device according to the second embodiment.

FIG. 6 is a block diagram showing the main signal converter 3 of a transmission device pertaining to this second embodiment. In this second embodiment the modulating NCOs 30a to 30d are replaced by variable modulating NCOs 35a to 35d. While not shown in the drawing, the variable quadrature demodulating NCO 49 in the first embodiment is replaced with a demodulating NCO for performing quadrature demodulation and frequency conversion with a phase from which the $\Delta\theta$ variable component has been eliminated (or a phase wherein $\Delta\theta=0$). Other components are analogous to those in the transmission device of the first embodiment described earlier.

Apart from replacing the quadrature demodulator of the variable quadrature demodulating NCO 49 shown in FIG. 5 with a quadrature modulator, the variable modulating NCOs 35a to 35d are analogous in design to the quadrature demodulating NCO 49. Accordingly, digital signals supplied by the frequency shifter 2 are shifted by $\Delta\theta$ during quadrature modulation. The analog section phase difference is compensated thereby, so that only nonlinear distortion by the amplifier 8 is converted in the DAC 43, whereby the DAC 43 can have lower bit precision and perform conversion faster.

Third Embodiment

The analog section phase difference occurring in the feedback signal can also be compensated by additionally providing a shifting multiplier for shifting the phase of the feedback signal.

Figure 2B:
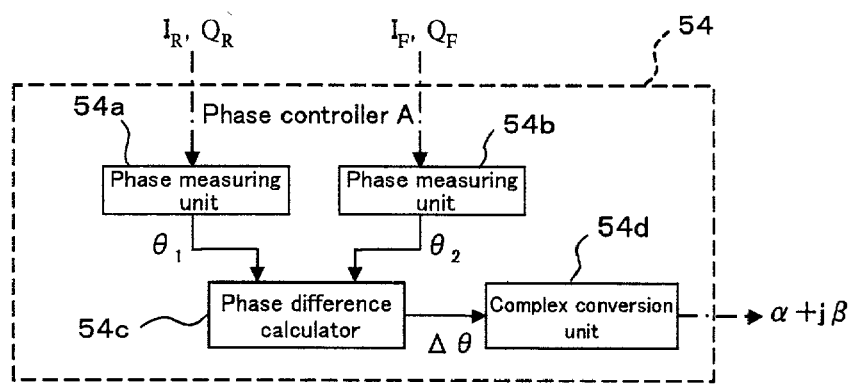
FIG. 2B is a block diagram showing the arrangement of the phase controller A for controlling the amount of shift by the shifting multiplier 100.
Figure 7:
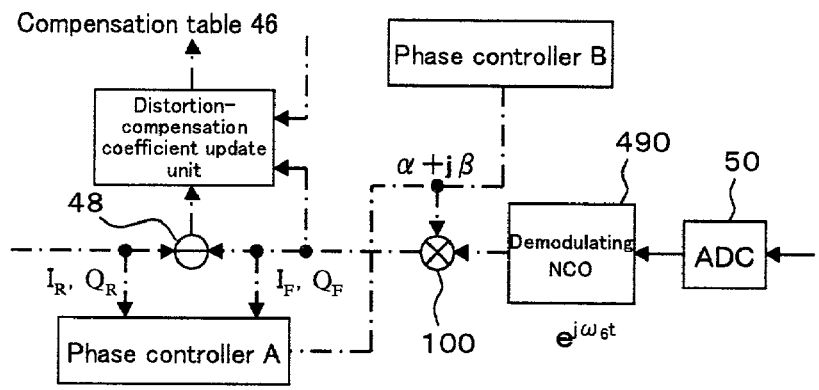
FIG. 7 is a block diagram showing a portion of a transmission device additionally provided with a shifting multiplier 100 located between a demodulating NCO and a subtracter.

FIG. 7 is a block diagram showing a portion of a transmission device additionally provided with a shifting multiplier 100 located between the demodulating NCO 490 (the variable demodulating NCO 49 of the first embodiment is replaced with one having non-variable phase) and the subtracter 48. FIG. 2B is a block diagram showing the arrangement of phase controller A for controlling the amount of shift by the shifting multiplier 100, and FIG. 4B is a block diagram showing the arrangement of the phase controller B for controlling the amount of shift by the shifting multiplier 100.

The phase controller A shown in FIG. 2B is analogous to the phase controller A shown in FIG. 2A, except for being additionally provided with a complex conversion unit 54d. This complex conversion unit 54d determines and outputs a complex number $(\alpha+j\beta)$ from a $\Delta\theta$ value supplied by the phase difference calculator 54c. The values $\alpha$ and $\beta$ are determined as $\alpha=\cos\Delta\theta$ and $\beta=\sin\Delta\theta$. The values $\alpha$ and $\beta$ determined in this way are supplied to the multiplier 100, and in the multiplier 100 are multiplied by the signal output from the demodulating NCO 490 (complex multiplication $(I+jQ)\times(\alpha+j\beta)$).

Figure 4B:
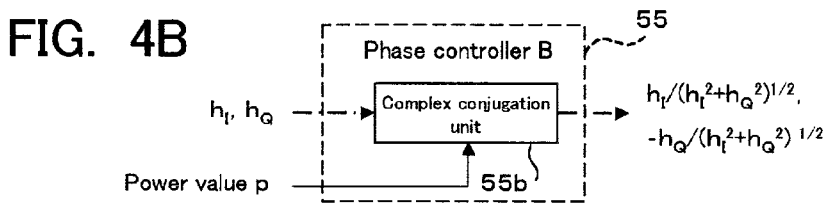

The phase controller B shown in FIG. 4B is composed of a complex conjugation unit 55b. This complex conjugation unit 55b determines the conjugate complex number $h_I$, $-h_Q$ (i.e. $h_I - jh_Q$) from the distortion-compensation coefficient $h_I$, $h_Q$ (i.e. $h_I + jh_Q$) supplied to it by the compensation table 46, and outputs this value normalized by $(h_I^2 + h_Q^2)^{1/2}$, i.e., the values $h_I/(h_I^2 + h_Q^2)^{1/2}$, $-h_Q/(h_I^2 + h_Q^2)^{1/2}$. The values $h_I/(h_I^2 + h_Q^2)^{1/2}$ and $-h_Q/(h_I^2 + h_Q^2)^{1/2}$ are respectively supplied as the values $\alpha$ and $\beta$ to the multiplier 100, where they are multiplied by the feedback signal (complex multiplication).

In this way, compensation of the analog section phase difference can be accomplished by additionally providing a multiplier 100, and using this multiplier 100 to multiply the feedback signal by a complex number $(\alpha+j\beta)$ corresponding to the phase difference $\Delta\theta$.

Fourth Embodiment

Alternatively, the analog section phase difference can be compensated by providing phase-shift multipliers between the frequency shifter 2 and the main signal converter 3.

Figure 8:
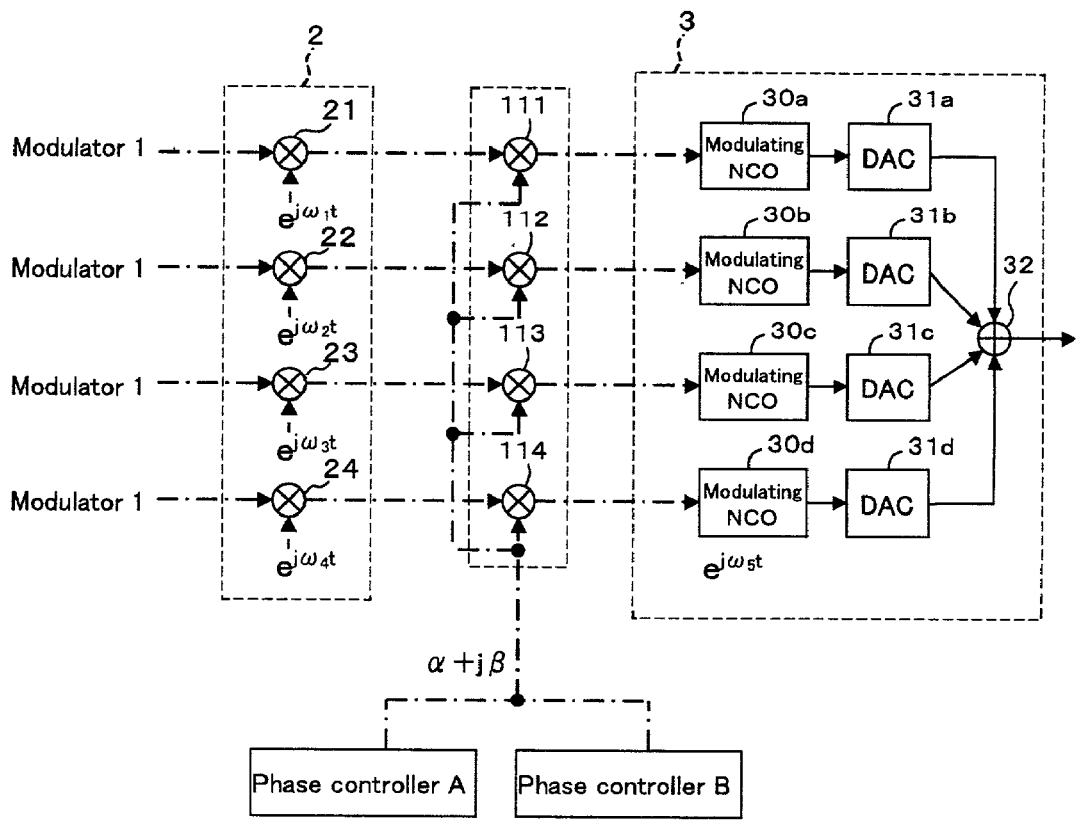
FIG. 8 is a block diagram of a portion of a transmission device according to the fourth embodiment.

FIG. 8 is a block diagram of a portion of a transmission device according to the fourth embodiment. In this fourth embodiment, multipliers 111 to 114 are provided between the frequency shifter 2 and the main signal converter 3. In these multipliers 111 to 114 signals from the frequency shifter 2 are multiplied by α and β values supplied by the phase controller A or B.

The phase controllers A and B are analogous to those in the third embodiment (FIG. 2B, FIG. 4B).

The variable demodulating NCO 49 of the first embodiment (see FIG. 1) is replaced with a demodulating NCO for performing quadrature demodulation and frequency conversion with a phase from which the Δθ variable component has been eliminated (or a phase wherein Δθ=0).

The analog section Phase difference can be compensated by means of this fourth embodiment.

Fifth Embodiment

Figure 9:
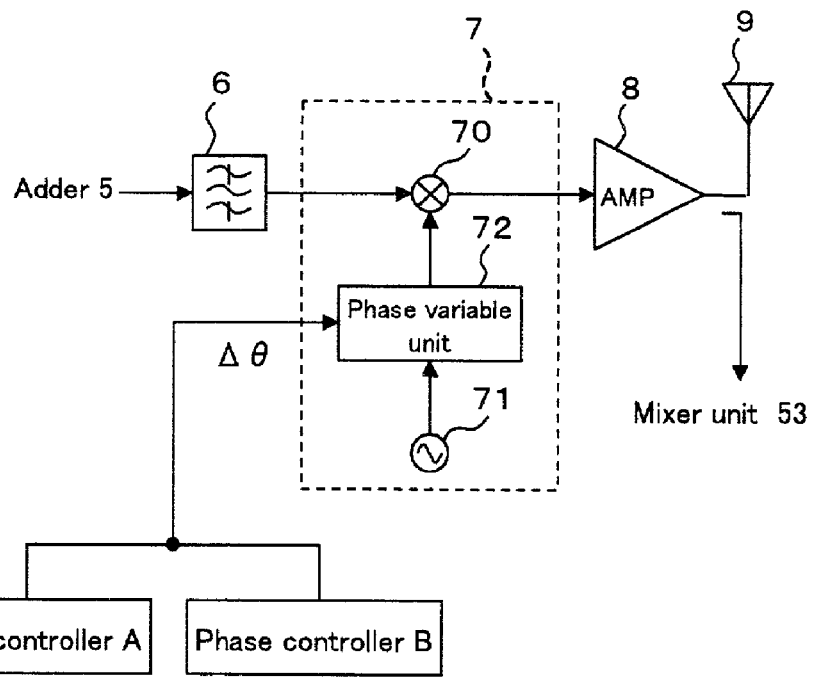
FIG. 9 is a block diagram of a mixer unit additionally provided with a phase variable unit.

The analog section phase difference can also be compensated in the mixer unit 7 shown in FIG. 1. FIG. 9 is a block diagram of a mixer unit 7 additionally provided with a phase variable unit 72. In FIG. 9 the variable demodulating NCO 49 of the first embodiment (see FIG. 1) is replaced with a demodulating NCO for performing quadrature demodulation and frequency conversion with a phase from which the Δθ variable component has been eliminated (or a phase wherein Δθ=0). Other components are analogous to those shown in FIG. 1. The phase controller A has the arrangement shown in FIG. 2A, and the phase controller B has the arrangement shown in FIG. 4A.

The phase variable unit 72 is supplied with a signal from the local oscillator 71 and a phase difference Δθ from the phase controller A or B. The phase variable unit 72 shifts the phase of the signal from the local oscillator 71 by the phase difference Δθ supplied to it by the phase controller A or B, and outputs the phase-shifted signal to the mixer 70. The mixer 70 then converts the frequency of the transmission signal from the IF band to the RF band by means of the signal supplied by the phase variable unit 72.

The analog section phase difference can be compensated by means of a mixer unit 7 of this arrangement.

Sixth Embodiment

Figure 10:
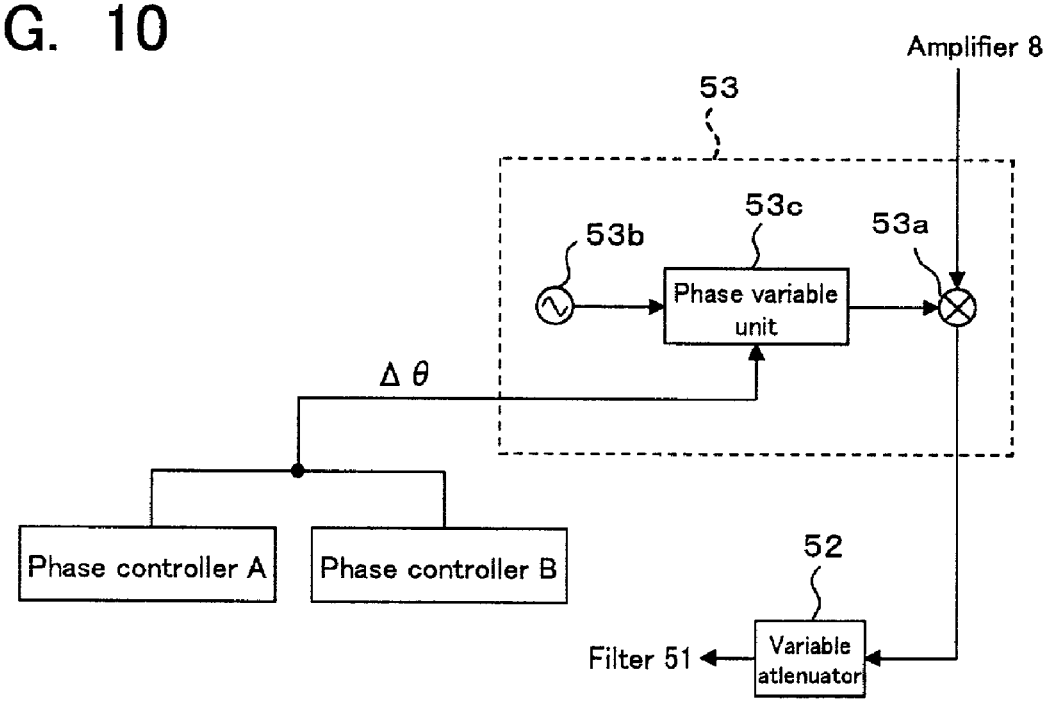
FIG. 10 is a block diagram of a mixer unit additionally provided with a phase variable unit.

The analog section phase difference can also be compensated in the mixer unit 53 shown in FIG. 1. FIG. 10 is a block diagram of a mixer unit 53 additionally provided with a phase variable unit 53c. In FIG. 10 the variable demodulating NCO 49 of the first embodiment (see FIG. 1) is replaced with a demodulating NCO for performing quadrature demodulation and frequency conversion with a phase from which the Δθ variable component has been eliminated (or a phase wherein Δθ=0). Other components are analogous to those shown in FIG. 1. The phase controller A has the arrangement shown in FIG. 2A, and the phase controller B has the arrangement shown in FIG. 4A.

The phase variable unit 53c is supplied with a signal from the local oscillator 53b and a phase difference Δθ from the phase controller A or B. The phase variable unit 53c shifts the phase of the signal from the local oscillator 53b by the phase difference Δθ supplied to it by the phase controller A or B, and outputs the phase-shifted signal to the mixer 53a. The mixer 53a then converts the frequency of the transmission signal from the RF band to the IF band by means of the signal supplied by the phase variable unit 53c.

The analog section phase difference can be compensated by means of a mixer unit 53 of this arrangement.

Seventh Embodiment

As noted, the phase controller A operates during the time that the transmission device is not performing compensation; during this time no communications data is being transmitted. Accordingly, the analog section phase difference can also be compensated using a predetermined test pattern signal.

Figure 2C:
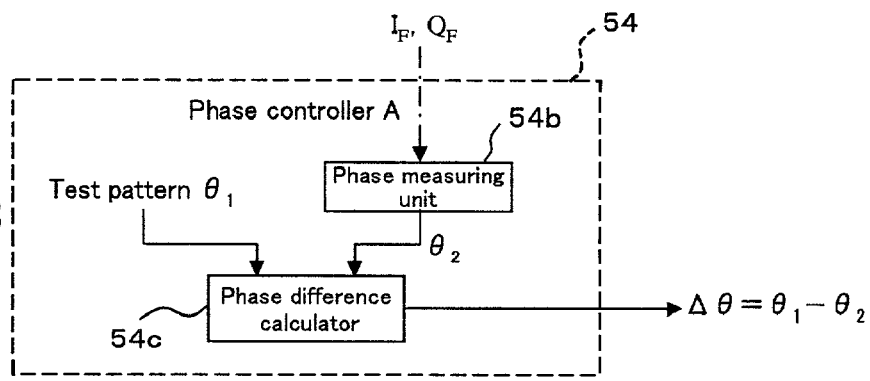
FIG. 2C is a block diagram of the phase controller A in an arrangement for compensating the analog section phase difference using a test pattern signal.

FIG. 2C is a block diagram of the phase controller A in an arrangement for compensating the analog section phase difference using a test pattern signal.

A predetermined test pattern signal is input to the transmission device. The phase $\theta_1$ (=$\tan^{-1}$(Q/I)) of the I component and Q component of the test pattern signal is known. Thus, there is no need to provide the phase controller A with the phase measuring unit 54a for measuring the phase of the reference signal $I_R$, $Q_R$; the known test pattern signal phase $\theta_1$ is supplied directly to a phase determining unit 54c. The test pattern signal phase $\theta_1$ may also be supplied by a phase generator (not shown) within or outside the phase controller A, or incorporated as a constant within the phase difference calculator 54c.

A phase controller A having the arrangement shown in FIG. 2C may be implemented in the second, fifth, or sixth embodiments, as well as in the first embodiment.

A test pattern signal of this kind can also be used for compensating the analog section phase difference during initialization etc.

Where the test pattern signal used does not comply with regulations for wireless communications, a switch or the like (not shown) for disconnecting the signal line from the amplifier 8 to the antenna 9 may be provided so that the test pattern signal is not transmitted from the antenna 9.

Eighth Embodiment

The analog section phase difference can also be compensated by converting the phase difference Δθ in the seventh embodiment into a complex number (α+jβ), and applying this complex number in the third or fourth embodiment.

Figure 2D:
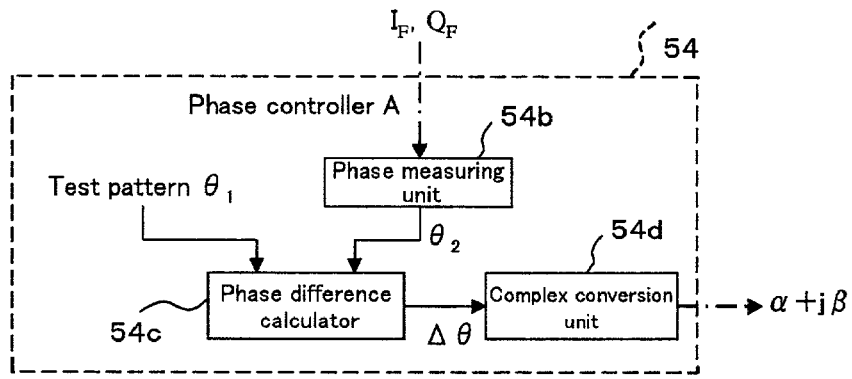
FIG. 2D is a block diagram showing another arrangement of the phase controller A for compensating the analog section phase difference using a test pattern signal.

FIG. 2D is a block diagram showing another arrangement of the phase controller A for compensating the analog section phase difference using a test pattern signal. The phase controller A in the seventh embodiment described earlier is here additionally provided with a complex conversion unit 54d. This complex conversion unit 54d is analogous to that in the third embodiment (see FIG. 2B), and converts the phase difference Δθ to a complex number (α+jβ).

By implementing this phase controller A in the third or fourth embodiment, the analog section phase difference can be compensated during initialization etc.

Where the test pattern signal used does not comply with regulations for wireless communications, a switch or the like (not shown) for disconnecting the signal line from the amplifier 8 to the antenna 9 may be provided so that the test pattern signal is not transmitted from the antenna 9.

Ninth Embodiment

Figure 3A:
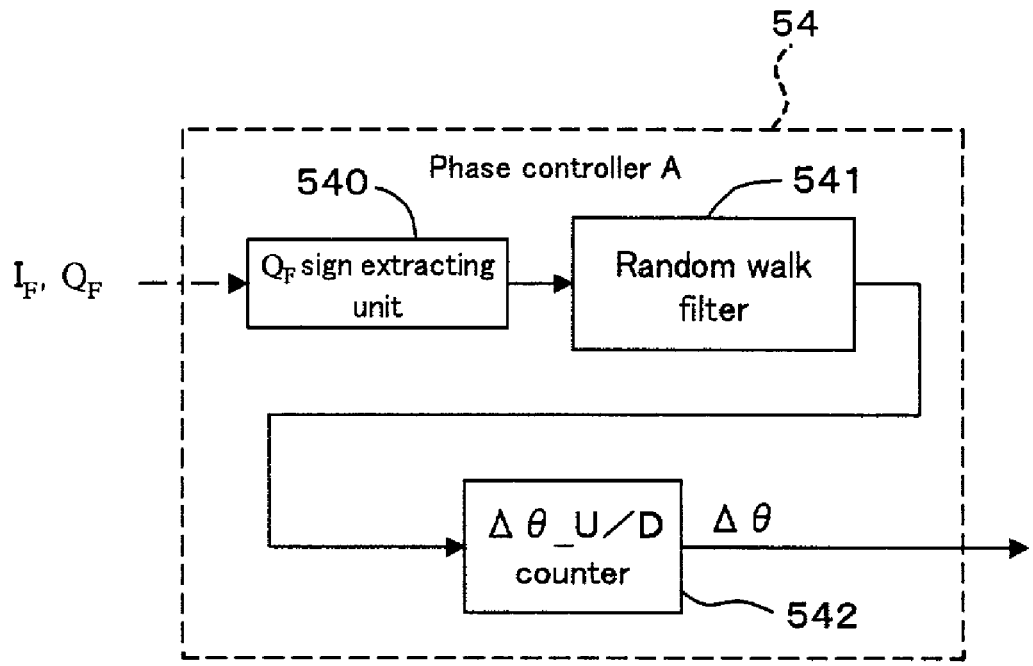
FIGS. 3A and 3B depict other arrangements of the phase controller A.

The phase controller A may also have the arrangement depicted in FIG. 3A. This phase controller A has a $Q_F$ sign extracting unit 540, a random walk filter 541, and a Δθ_up/down counter 542.

During the initialization process etc., the transmission device inputs as a transmission signal a test pattern signal in which the value of the digital Q signal is zero (i.e. the value of reference signal $Q_R$ is also zero).

The feedback signal $I_F$, $Q_F$ is input to the $Q_F$ sign extracting unit 540. The $Q_F$ sign extracting unit 540 extracts the $Q_F$ sign of the input feedback signal $I_F$, $Q_F$, and supplies as a pulse signal to the random walk filter 541 a "1" if the sign is "+", a "−1" if the sign is "−", and a "0" if the value of $Q_F$ is zero (i.e. where there is no ± sign).

The random walk filter 541 has an internal up/down counter (not shown). This up/down counter is set to an initial value of "0", and has an upper limit value "+T" and a lower limit value "−T" (T is a positive integer). When the random walk filter 541 is supplied with a "1" by the $Q_F$ sign extracting unit 540, the value in the internal up/down counter is incremented by 1, when supplied with a "−1" the value in the internal up/down counter is decremented by 1, and when supplied with a "0" the value in the internal up/down counter remains unchanged. When the count in the up/down counter reaches the upper limit value "+T" a "1" pulse signal is output to the Δθ_up/down counter 542, and when it reaches the lower limit value "−T" a "−1" pulse signal is output to the Δθ_up/down counter 542. After the pulse signal is output, the count is reset to zero.

In this way, the random walk filter 541 prevents changes in the feedback signal $Q_F$ from being reflected directly in the phase difference Δθ, so that they are reflected only after a certain delay interval. Thus, the upper limit value "+T" and lower limit value "−T" discussed above are determined by the selected delay interval.

The Δθ_up/down counter 542 is set to an initial count value of zero. When supplied with a pulse signal "1" from the random walk filter 541, the Δθ_up/down counter 542 increments the count by 1, and when supplied with a pulse signal "−1" it decrements the count by 1. It then outputs the count as Δθ.

By controlling Δθ in this way, the feedback signal $Q_F$ is controlled to zero. As a result, phase difference between the feedback signal $Q_F$ and the test pattern digital input signal (i.e. the reference signal $Q_R=0$) is eliminated and the analog section phase difference is compensated.

The random walk filter 541 is merely exemplary; another type of filter having a delay interval could be substituted.

Tenth Embodiment

Figure 3B:
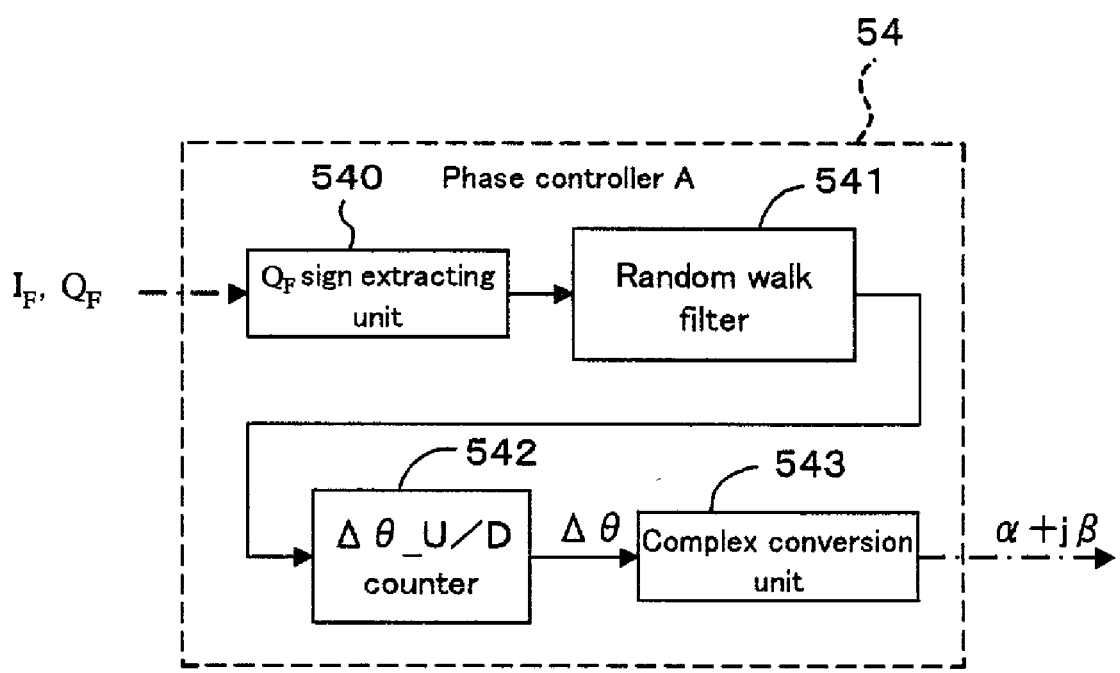

The phase controller A of FIG. 3A may be additionally provided with a complex conversion unit 543 as shown in FIG. 3B, and Δθ converted to a complex number (α+jβ) for output. The complex conversion unit 543 has the same arrangement as the complex conversion unit 54d of the third embodiment (see FIG. 2B) or the complex conversion unit 54d of the fourth embodiment (see FIG. 2D).

The values α and β output by the complex conversion unit 543 are supplied to a multiplier 100 like that in the third embodiment (see FIG. 7) or multipliers 111 to 114 like those in the fourth embodiment (see FIG. 8).

Eleventh Embodiment

Where the phase controller B activates at the power value at point C or power values below the power value at point C, as shown in FIG. 12B, the analog signal output by the amplifier 8 will not contain nonlinear distortion (amplitude distortion and phase distortion) produced by the amplifier 8. Accordingly, when there is no analog section phase difference the distortion-compensation coefficients will be $h_I=1$ and $h_Q=0$; when there is some analog section phase difference, the distortion-compensation coefficient is $h_I \neq 1$ or $h_Q \neq 0$.

Thus the analog section phase difference can also be compensated by having the phase controller B control the signal phase such that $h_I=1$ or $h_Q=0$.

Figure 4C:
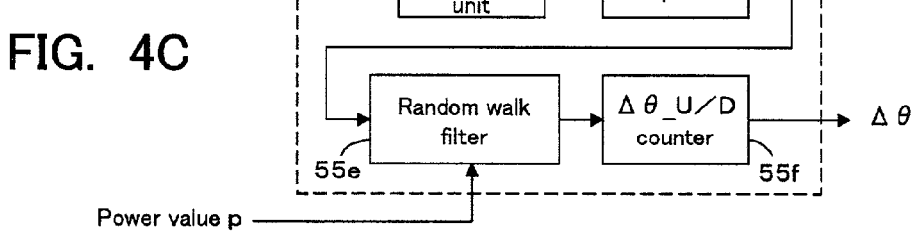

FIG. 4C is a block diagram showing the arrangement of a phase controller B for controlling the signal phase such that $h_Q=0$. This phase controller B has an $h_Q$ extracting unit 55c, a comparator 55d, a random walk filter 55e, and a Δθ_up/down counter 55f.

The distortion-compensation coefficients $h_I$, $h_Q$ are input to the $h_Q$ extracting unit 55c from the compensation table 46. The $h_Q$ extracting unit 55c extracts only the $h_Q$ component from the input distortion-compensation coefficients $h_I$, $h_Q$ and outputs it to the comparator 55d.

The comparator 55d compares the distortion-compensation coefficient $h_Q$ to zero, and supplies to the random walk filter 55e a pulse signal that is a "1" if the coefficient greater than zero (i.e. where the value of the distortion-compensation coefficient $h_Q$ is positive), a "−1" if it is less than zero (i.e. where the value of the distortion-compensation coefficient $h_Q$ is negative), or a "0" if it is equal to zero.

The random walk filter 55e has an internal up/down counter (not shown). This up/down counter is set to an initial value of "0", and has an upper limit value "+S" and a lower limit value "−S" (S is a positive integer).

In addition to the output value from the comparator 55d, a power value p from the power calculator 44 (see FIG. 1) is also input to the random walk filter 55e. The random walk filter 55e has an operation/nonoperation table (not shown) corresponding to the input power values p. This operation/nonoperation table indicates whether or not the random walk filter 55e should operate. When a power value p is a certain value in the linear region of the amplifier 8 or all values contained in the linear region, the random walk filter 55e is instructed to operate, and when a power value p is a certain value in the nonlinear region of the amplifier 8, the random walk filter 55e is instructed not to operate.

When the random walk filter 55e is operational in response to a particular power value p and is supplied with a "1" by the $h_Q$ extracting unit 55c, the value in the internal up/down counter is incremented by 1, when supplied with a "−1" the value in the internal up/down counter is decremented by 1, or when supplied with a "0" the value in the internal up/down counter is unchanged. When the count in the up/down counter reaches the upper limit value "+S" a "1" pulse signal is output to the Δθ_up/down counter 55f, and when it reaches the lower limit value "−S" a "−1", pulse signal is output to the Δθ_up/down counter 55f. The count is then reset to zero.

When on the other hand random walk filter 55e is not operational in response to a particular power value p, regardless of the value from the $h_Q$ extracting unit 55c, the value in the internal up/down counter remains unchanged, and no pulse signal is output to the Δθ_up/down counter 55f.

In this way the random walk filter 55e prevents changes in the distortion-compensation coefficient $h_Q$ from being reflected directly in the phase difference Δθ, so that these are reflected only after a certain delay interval. Thus, the upper limit value "+S" and lower limit value "−S" discussed above are determined by the extent of the delay interval at which changes are reflected.

The Δθ_up/down counter 55f is set to an initial count value of zero. When supplied with a pulse signal "1" from the random walk filter 55e, the Δθ_up/down counter 55f increments the count by 1, and when supplied with a pulse signal "−1" it decrements the count by 1. It then outputs the count as Δθ.

By controlling Δθ in this way, the distortion-compensation coefficient $h_Q$ is controlled to zero. As a result, the analog section phase difference is compensated.

By substituting an $h_I$ extracting unit for the $h_Q$ extracting unit 55c and substituting the comparator 55d with one that compares $h_I$ with 1, the analog section phase difference can be compensated by controlling $h_I$ to 1. The random walk filter 55e is merely exemplary; another type of filter having a delay interval could be substituted.

Twelfth Embodiment

Figure 4D:
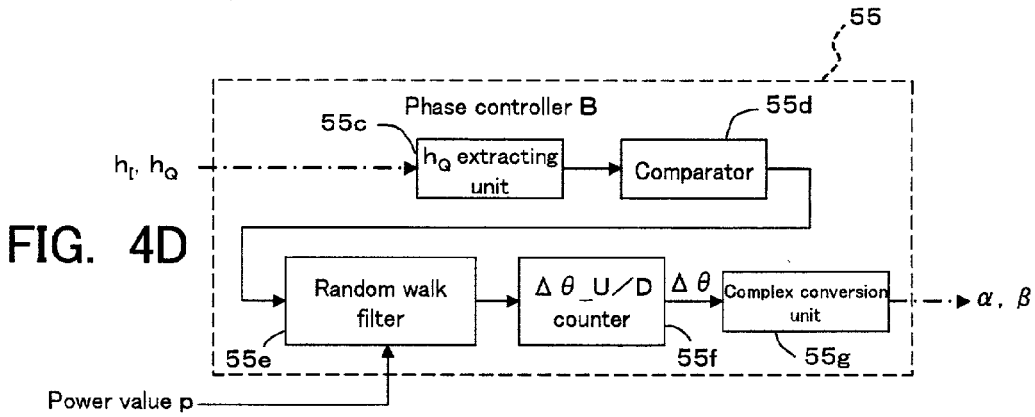

The phase controller B of FIG. 4C may be additionally provided with a complex conversion unit 55g as shown in FIG. 4D, and Δθ converted to a complex number (α+jβ) for output. A complex conversion unit 55d has the same arrangement as the complex conversion unit 54d of the third embodiment (see FIG. 2B) or the complex conversion unit 54d of the fourth embodiment (see FIG. 2D).

The values α and β output by the complex conversion unit 54d are supplied to the multiplier 100 like that in the third embodiment (see FIG. 7) or the multipliers 111 to 114 like those in the fourth embodiment (see FIG. 8).

Thirteenth Embodiment

The phase controllers B in the preceding embodiments are designed to compensate the analog section phase difference; however, the phase controller B could be designed to compensate phase the distortion produced by the amplifier 8, in addition to the analog section phase difference. In the following description, the phase controller B designed to compensate both the analog section phase difference and phase distortion produced by the amplifier 8 shall be designated "phase controller C" to distinguish it from the phase controllers B in the preceding embodiments.

Figure 11:
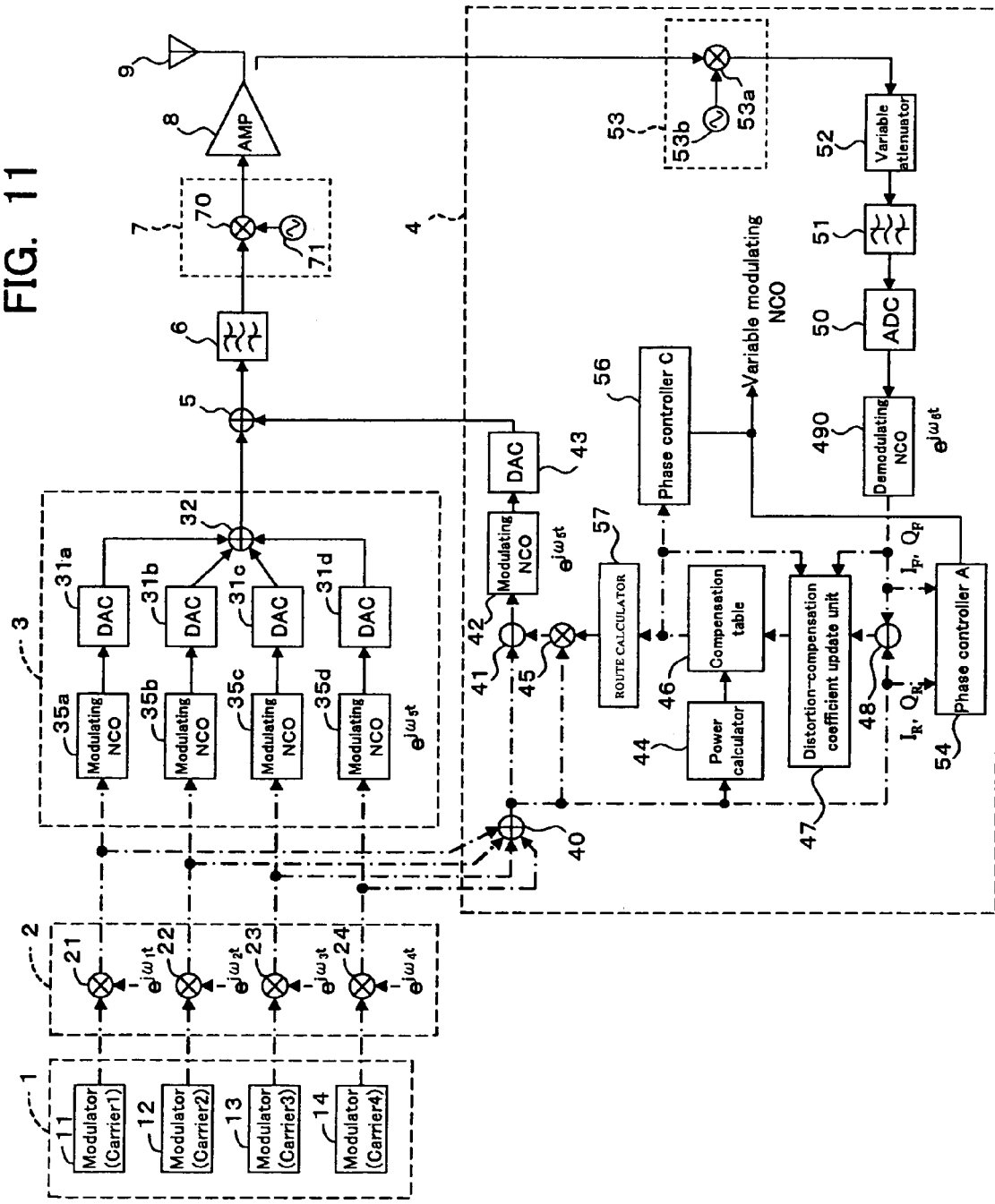
FIG. 11 is a block diagram of a transmission device using a phase controller C.

FIG. 11 is a block diagram of a transmission device using a phase controller C (reference numeral 56) that can compensate both the phase distortion by the amplifier 8 and the analog section phase difference.

The transmission device shown in FIG. 11 differs from the transmission device in FIG. 1 in the following respects: the phase controller C does not input the power values p from the power calculator 44; a route calculator 57 is provided between the compensation table 46 and the multiplier 45; the variable demodulating NCO 49 is replaced with a demodulating NCO 490 that does not have a variable unit; and the modulating NCOs 30a to 30d are replaced with phase-variable variable modulating NCOs 35a to 35d. Other elements are analogous to those in FIG. 1, and as such are assigned the same reference numerals and not described in unnecessary detail.

Like the phase controller B, the phase controller C has a closed feedback loop, and is operational during the time that the transmission device is performing compensation (i.e. when the required transmission signal is being transmitted); on the other hand, it differs from the phase controller B in that it lacks the operation/nonoperation select function in response to particular power values p, but rather is constantly operational to compensate phase difference and phase distortion. Accordingly, the phase controller C does not input power values p from the power calculator 44.

The arrangement of the phase controller C is quite similar to that of the phase controller B shown in FIG. 4A, but since it does not input power values p the operation/nonoperation table described earlier is omitted. For example, the Δθ calculator 55a in FIG. 4A would lack power value p input and would not be provided with an operation/nonoperation table. Accordingly, the Δθ calculator 55a is constantly operational to calculate and output Δθ values from the input distortion-compensation coefficients $h_I$, $h_Q$.

The Δθ values output from the phase controller C are supplied to the variable modulating NCOs 35a to 35d described in the second embodiment, and signal phase is shifted by Δθ during quadrature modulation.

The route calculator 57 calculates the magnitude $(h_I'^2+h_Q'^2)^{1/2}$ of the distortion-compensation coefficients $h_I$, $h_Q$ supplied by the compensation table 46, and supplies this value to the multiplier 45. The multiplier 45 multiplies $(h_I'^2+h_Q'^2)^{1/2}$ by both the I signal and Q signal. The reason for providing the route calculator 57 is so that the phase controller C compensates phase distortion by the amplifier 8 in addition to the analog section phase difference, and thus the compensation signal supplied to the multiplier 45 need only compensate for phase distortion by the amplifier 8.

In this way, phase distortion by the amplifier 8 and the analog section phase difference are compensated by the phase controller C. Amplitude distortion by the amplifier 8, on the other hand, is compensated in the adder 5 via the DAC 43.

In the present embodiment, the number of inputs to the adder 32 may be changed from four to five, and the adder 5 is omitted, supplying the DAC 43 output signal to the five inputs adder 32. It is also possible to have a DAC convert the digital signal (I signal and Q signal) from the frequency shifter 2 to an analog signal, then subject this signal to quadrature demodulation in a quadrature demodulator and supply it to the adder 32. Alternatively, the analog signal from the filter 51 may be subjected to quadrature demodulation in a quadrature demodulator and then converted into a digital signal by an ADC.

Fourteenth Embodiment

As shown in FIG. 8, the variable modulating NCOs 35a to 35d in the thirteenth embodiment described above may be replaced with the modulating NCOs 30a to 30d lacking a phase variable unit—analogous to those in the first embodiment—, and phase-shift multipliers 111 to 114 provided. Values α and β from a phase-shift controller C can then be supplied to these multipliers 111 to 114.

Phase-shift controller C is substantially identical to complex conjugation unit 55b shown in FIG. 4B. However, like the phase-shift controller C in the thirteenth embodiment, it lacks the operation/nonoperation select function in response to particular power values p, but rather is constantly operational to compensate phase difference and phase distortion. Accordingly, the complex conjugation circuit 55b lacks power value p input and is not provided with an operation/nonoperation table. The complex conjugation circuit 55b is therefore constantly operational to calculate and output α and β from input distortion-compensation coefficients $h_I$, $h_Q$.

Other Embodiments

Different locations may be employed for compensation of phase difference by the phase controller A and compensation of phase difference by the phase controller B. For example, compensation of phase difference by the phase controller A could be performed in the variable demodulating NCO 49 (see FIG. 1) while performing compensation of phase difference by the phase controller B in the variable modulators NCOs 35a to 35d (see FIG. 6), or the reverse strategy could be used. Alternatively, compensation of phase difference by the phase controller A could be performed in the multiplier 100 (see FIG. 7) while performing compensation of phase difference by the phase controller B in the mixer unit 7 (see FIG. 9), or the reverse strategy could be used. Phase difference compensation may also be performed at other locations.

The locations for compensation of phase difference by the phase controller A and compensation of phase difference (and phase distortion) by the phase controller C may also be changed.

The transmission device arrangements described hereinabove are merely exemplary. Alternative transmission device arrangements comprising phase difference compensation locations different from the phase difference compensation locations shown in FIG. 1, FIG. 11 etc. are also possible.

According to the present invention, less bit precision by the digital/analog converter is required than when converting a predistorted digital input signal to an analog signal. Thus, faster conversion is possible.

The digital/analog converter that converts the compensated signal is supplied only with a signal that compensates nonlinear distortion by the amplifier, so bit precision can be lower than that required where signals compensating other distortion must be converted as well, making conversion faster to a corresponding degree.

What is claimed is:

1. A transmission device for predistorting a digital input signal in order to compensate nonlinear distortion produced by an amplifier, then converting said digital input signal into an analog signal, and amplifying said analog signal by means of said amplifier, and transmitting the amplified analog signal, comprising:
   a first digital/analog converter for converting said digital input signal into a first analog signal;
   a distortion-compensating signal generator for generating a distortion-compensating signal from said digital input signal and a predistortion signal, said predistortion signal being generated by predistorting said digital input signal on the basis of a distortion-compensation coefficient determined from said digital input signal supplied as a reference signal, and a feedback signal fed back from the output of said amplifier;
   a second digital/analog converter for converting the distortion-compensating signal generated by said distortion-compensating signal generator into a second analog signal;
   an adder for adding said second analog signal to said first analog signal and supplying the added analog signal to said amplifier; and
   a first phase difference compensator for compensating any phase difference in said transmission device other than phase distortion included in said nonlinear distortion of said amplifier for said feedback signal, said phase difference being detected on the basis of said feedback signal and said reference signal, and supplying a phase difference-compensated feedback signal to said distortion-compensating signal generator.

2. The transmission device according to claim 1 wherein said distortion-compensating signal generator comprises:
   a distortion-compensation table having distortion-compensation coefficients corresponding to each power value of said digital input signal;
   a distortion-compensation coefficient update unit for determining a new distortion-compensation coefficient from said reference signal, said feedback signal, and the distortion-compensation coefficient corresponding to said digital input signal and for updating said distortion-compensation table by using the newly determined distortion-compensation coefficient;
   a multiplier for multiplying the distortion-compensation coefficient corresponding to said digital input signal; and
   a subtracter for determining a differential signal from an output signal of said multiplier and said digital input signal, and outputting said differential signal as said distortion-compensating signal.

3. The transmission device according to claim 1 wherein, when said first phase difference compensator is in a state in which said adder is not performing addition of said first analog signal and said second analog signal, when said first analog signal is output as the output signal of said adder, and in a state in which said amplifier is operating in the linear region, said first phase difference compensator detects said phase difference on the basis of said reference signal and said feedback signal, and thereby compensates for said phase difference.

4. The transmission device according to claim 3 wherein said digital input signal and said reference signal are composed of in-phase component and quadrature component signals;
   said feedback signal is converted to digital in-phase component and quadrature component signals and supplied to said first phase difference compensator; and
   said first phase difference compensator determines a phase of said reference signal from the in-phase component and quadrature component signals that compose said reference signal, determines a phase of said feedback signal from the in-phase component and quadrature component signals that compose said feedback signal, and determines said phase difference as the difference between the phase of said reference signal and the phase of said feedback signal.

5. The transmission device according to claim 3 wherein said digital input signal and said reference signal are composed of in-phase component and quadrature component signals of a predetermined test pattern;
   said feedback signal is converted to digital in-phase component and quadrature component signals and supplied to said first phase difference compensator; and
   said first phase difference compensator determines a phase of said feedback signal from the in-phase component and quadrature component signals that compose said feedback signal, and determines said phase difference as the difference between a predetermined phase of said test pattern signal and a predetermined phase of said feedback signal.

6. The transmission device according to claim 3 wherein said digital input signal is a test pattern signal composed of in-phase component and quadrature component signals, said quadrature component being zero;
   said feedback signal is converted to digital in-phase component and quadrature component signals and supplied to said first phase difference compensator; and
   said first phase difference compensator compensates said phase difference so that the quadrature component composing said feedback signal becomes zero.

7. The transmission device according to claim 6 wherein said first phase difference compensator determines a sign of the quadrature component that composes said feedback signal; increments or decrements, on the basis of said sign, an internal counter in a random walk filter; increments or decrements, on the basis of the value output by the random walk filter, a phase counter that indicates a phase difference value; and performs compensation of said phase difference on the basis of the count in said phase counter.

8. The transmission device according to claim 4, further comprising a quadrature modulator for performing quadrature modulation of the digital in-phase component and quadrature component signals that compose said digital input signal and supplying the modulated digital input signal to said first digital/analog converter, or performing quadrature modulation of an analog output signal from said first digital/analog converter to generate said first analog signal and supplying the first analog signal to said adder;
   wherein said first phase difference compensator performs compensation of said phase difference by means of shifting, by an amount corresponding to the determined phase difference, the phase of the output signal of said quadrature modulator during quadrature modulation by said quadrature modulator.

9. The transmission device according to claim 4, further comprising:
a quadrature demodulator for performing quadrature demodulation of the output signal of said amplifier and supplying, to said first phase difference compensator, the signal separated, by means of quadrature demodulation, into in-phase and quadrature components, wherein said first phase difference compensator performs compensation of said phase difference by means of shifting, by an amount corresponding to the determined phase difference, the phase of the output signal of said quadrature demodulator during quadrature demodulation by said quadrature demodulator.

10. The transmission device according to claim 4 wherein said first phase difference compensator comprises a multiplier for performing multiplication of the in-phase component and quadrature component signals that compose said digital input signal by a numerical value comprising a real part and an imaginary part, said multiplier being arranged before said first digital/analog converter, wherein the determined phase difference is converted into the numerical value, comprising the real part and the imaginary part, which is supplied to said multiplier.

11. The transmission device according to claim 4, further comprising a first frequency converter for converting the frequency band of an analog signal input to said amplifier, said first frequency converter being arranged before said amplifier,
wherein said first phase difference compensator performs compensation of said phase difference by means of shifting, by an amount corresponding to the determined phase difference, the phase of an output signal of said first frequency converter during frequency conversion by said first frequency converter.

12. The transmission device according to claim 4, further comprising a second frequency converter for converting the frequency band of said feedback signal, said second frequency converter being arranged after said amplifier,
wherein said first phase difference compensator performs compensation of said phase difference by means of shifting, by an amount corresponding to the determined phase difference, the phase of an output signal of said second frequency converter during frequency conversion by said second frequency converter.

13. The transmission device according to claim 2 further comprising:
a second phase difference compensator for detecting a phase difference on the basis of the distortion-compensation coefficient corresponding to the power value of said digital input signal, compensating said phase difference for said feedback signal, and supplying said phase difference-compensated feedback signal to said distortion-compensating signal generator.

14. The transmission device according to claim 13 wherein said second phase difference compensator is operational during the time that addition of said first analog signal and said second analog signal is being performed by said adder, and where the power value of said digital input signal is a power value corresponding to the linear region of said amplifier, a power value corresponding to maximum nonlinear distortion by said amplifier, or a power value lying between the power value corresponding to maximum nonlinear distortion by said amplifier and the power value corresponding to the boundary of the linear region and the nonlinear region.

15. The transmission device according to claim 14 wherein said distortion-compensation coefficient is composed of a numerical value corresponding to a real part and a numerical value corresponding to an imaginary part, and
said second phase difference compensator is operational when the power value of said digital input signal is a power value corresponding to the linear region of said amplifier, and compensates said phase difference in such a way that the real part of said distortion-compensation coefficient becomes "1" or the imaginary part of said distortion-compensation coefficient becomes "0".

16. The transmission device according to claim 15 wherein said second phase difference compensator compares the numerical value corresponding to the real part that composes said distortion-compensation coefficient to "1" or compares the numerical value corresponding to the imaginary part that composes said distortion-compensation coefficient to "0", increments or decrements an internal counter of a random walk filter based on a result of the comparison; increments or decrements, on the basis of a value output by said random walk filter, a phase counter for indicating a phase difference value; and performs compensation of said phase difference on the basis of a count value in said phase counter.

17. The transmission device according to claim 13, wherein said digital input signal is composed of in-phase component and quadrature component signals,
further comprising: a quadrature modulator for performing quadrature modulation of said in-phase component and quadrature component signals and supplying the modulated digital input signal to said first digital/analog converter, or performing quadrature modulation of an analog output signal from said first digital/analog converter to generate said first analog signal and supplying the first analog signal to said adder; and
wherein said second phase difference compensator performs compensation of said phase difference by means of shifting, by an amount corresponding to the detected phase difference, the phase of an output signal of said quadrature modulator during quadrature modulation by said quadrature modulator.

18. The transmission device according to claim 13, wherein said digital input signal is composed of in-phase component and quadrature component signals, wherein
said second phase difference compensator comprises: a multiplier for performing multiplication of the in-phase component and quadrature component signals that compose said digital input signal by a numerical value comprising a real part and an imaginary part, said multiplier being arranged before said quadrature multiplier; and the detected phase difference is converted into the numerical value, comprising the real part and the imaginary part, which is supplied to said multiplier.

19. The transmission device according to claim 13, wherein said digital input signal is composed of in-phase component and quadrature component signals,
further comprising a quadrature demodulator for performing quadrature demodulation of the in-phase component and quadrature component of said feedback signal and supplying the demodulate feedback signal to said distortion-compensating signal generator;
wherein said second phase difference compensator performs compensation of said phase difference by means of shifting, by an amount corresponding to the detected phase difference, the phase of an output signal of said quadrature demodulator during quadrature demodulation by said quadrature demodulator.

20. The transmission device according to claim 13, further comprising a first frequency converter for converting the frequency band of an analog signal input to said amplifier, said first frequency converter being arranged before said amplifier,
   wherein said second phase difference compensator performs compensation of said phase difference by means of shifting, by an amount corresponding to the detected phase difference, the phase of an output signal of said first frequency converter during frequency conversion by said first frequency converter.

21. The transmission device according to claim 13, further comprising a second frequency converter for converting the frequency band of said feedback signal, said second frequency converter being arranged after said amplifier,
   wherein said second phase difference compensator performs compensation of said phase difference by means of shifting, by an amount corresponding to the detected phase difference, the phase of an output signal of said second frequency converter during frequency conversion by said second frequency converter.

22. The transmission device according to claim 2, further comprising a third phase difference compensator for detecting a phase difference and the phase distortion that constitutes said nonlinear distortion by said amplifier, compensating said phase distortion and said phase difference on the basis of the distortion-compensation coefficient corresponding to the power value of said digital input signal, and supplying to said distortion-compensating signal generator a feedback signal compensated for said phase distortion and said phase difference.

23. The transmission device according to claim 22 wherein said third phase difference compensator is operational for all power values of said digital input signal during the time that the addition of said first analog signal and said second analog signal is being performed by said adder.

24. The transmission device according to claim 23 wherein said digital input signal is composed of in-phase component and quadrature component signals,
   further comprising a quadrature modulator for performing quadrature modulation of said in-phase component and quadrature component signals of said digital input signal and supplying the modulated digital input signal to said first digital/analog converter, or performing quadrature modulation of an analog output signal from said first digital/analog converter to generate said first analog signal and supplying the first analog signal to said adder; and
   wherein said third phase difference compensator performs compensation of said phase distortion and said phase difference by means of shifting, by an amount corresponding to the detected phase difference, the phase of an output signal of said quadrature modulator during quadrature modulation by said quadrature modulator.

25. The transmission device according to claim 23 wherein said digital input signal is composed of in-phase component and quadrature component signals; and
   said third phase difference compensator comprises a multiplier for performing multiplication of the in-phase component and quadrature component signals that compose said digital input signal by a numerical value, comprising a real part and an imaginary part, said multiplier being arranged before said quadrature modulator, wherein the detected phase difference is converted into the numerical value, comprising the real part and the imaginary part, which is supplied to said multiplier.

26. A transmission method for predistorting a digital input signal in order to compensate nonlinear distortion amplifier, then converting said digital input signal into an analog signal, and amplifying said analog signal by means of said amplifier, and transmitting the amplified analog signal, comprising the steps of:
   converting said digital input signal into a first analog signal;
   generating a distortion-compensating signal using a distortion-compensating signal generator from said digital input signal and a predistortion signal, said predistortion signal being generated by predistorting said digital input signal on the basis of a distortion-compensation coefficient determined from said digital input signal supplied as a reference signal, and a feedback signal fed back from the output of said amplifier;
   converting the distortion-compensating signal into a second analog signal;
   adding said second analog signal to said first analog signal, and supplying, to said amplifier, the analog signal resulting from this addition operation; and
   compensating any phase difference other than phase distortion included in said nonlinear distortion of said amplifier for said feedback signal, said phase difference being detected on the basis of said feedback signal and said reference signal, and supplying a phase difference-compensated feedback signal to said distortion-compensating signal generator.

* * * * *